(12) United States Patent
Kim et al.

(10) Patent No.: US 11,217,457 B2
(45) Date of Patent: Jan. 4, 2022

(54) METHOD OF FABRICATING A SEMICONDUCTOR DEVICE

(71) Applicant: Samsung Electronics Co., Ltd., Suwon-si (KR)

(72) Inventors: Seungjin Kim, Hwaseong-si (KR); Byung-Hyun Lee, Hwaseong-si (KR); Yoonyoung Choi, Seoul (KR); Tae-Kyu Kim, Hwaseong-si (KR); Heesook Cheon, Seoul (KR); Bo-Wo Choi, Suwon-si (KR); Hyun-Sil Hong, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 58 days.

(21) Appl. No.: 16/863,244

(22) Filed: Apr. 30, 2020

(65) Prior Publication Data
US 2021/0050221 A1    Feb. 18, 2021

(30) Foreign Application Priority Data
Aug. 16, 2019  (KR) .................. 10-2019-0100435

(51) Int. Cl.
*H01L 21/311* (2006.01)
*H01L 21/027* (2006.01)
*H01L 21/48* (2006.01)

(52) U.S. Cl.
CPC ...... *H01L 21/31144* (2013.01); *H01L 21/027* (2013.01); *H01L 21/48* (2013.01)

(58) Field of Classification Search
None
See application file for complete search history.

(56) References Cited

U.S. PATENT DOCUMENTS

| | | |
|---|---|---|
| 6,461,941 B2 | 10/2002 | Kim |
| 7,101,572 B2 | 9/2006 | Santos et al. |
| 8,444,867 B2 | 5/2013 | Yang |
| 8,530,324 B2 | 9/2013 | Park et al. |
| 9,129,877 B2 | 9/2015 | Suzuki et al. |

(Continued)

FOREIGN PATENT DOCUMENTS

| | | |
|---|---|---|
| JP | 2012-209350 A | 10/2012 |
| JP | 2014-179511 A | 9/2014 |

(Continued)

*Primary Examiner* — Alexander G Ghyka
(74) *Attorney, Agent, or Firm* — Harness, Dickey & Pierce, P.L.C.

(57) ABSTRACT

A method of fabricating a semiconductor device including preparing a substrate including a wafer inner region and a wafer edge region, the wafer inner region including a chip region and a scribe lane region, sequentially stacking a mold layer and a supporting layer on the substrate, forming a first mask layer on the supporting layer, the first mask layer including a first stepped region on the wafer edge region, forming a step-difference compensation pattern on the first stepped region, forming a second mask pattern including openings, on the first mask layer and the step-difference compensation pattern, and sequentially etching the first mask layer, the supporting layer, and the mold layer using the second mask pattern as an etch mask to form a plurality of holes in at least the mold layer may be provided.

20 Claims, 27 Drawing Sheets

(56) References Cited

U.S. PATENT DOCUMENTS

| | | | |
|---|---|---|---|
| 9,659,940 B2 | 5/2017 | Park et al. | |
| 9,761,591 B2 | 9/2017 | Kim et al. | |
| 2008/0160779 A1* | 7/2008 | Detweiler | H01L 21/76816 438/758 |
| 2017/0317052 A1* | 11/2017 | Rubin | H01L 25/00 |
| 2019/0146330 A1* | 5/2019 | Yang | G03F 1/44 257/314 |
| 2020/0105777 A1* | 4/2020 | Lin | H01L 27/11548 |
| 2020/0258755 A1* | 8/2020 | Shih | H01L 21/3085 |
| 2020/0312859 A1* | 10/2020 | Otsu | H01L 25/0657 |
| 2020/0411538 A1* | 12/2020 | Zhao | H01L 27/11573 |

FOREIGN PATENT DOCUMENTS

| | | |
|---|---|---|
| KR | 2001-0064054 A | 7/2001 |
| KR | 10-0500934 B1 | 7/2005 |
| KR | 10-0521453 B1 | 10/2005 |
| KR | 10-0595319 B1 | 6/2006 |
| KR | 10-0598983 B1 | 7/2006 |
| KR | 10-20070071615 A | 7/2007 |
| KR | 10-2008-0084423 A | 9/2008 |
| KR | 10-0905160 B1 | 6/2009 |
| KR | 10-1051159 B1 | 7/2011 |

\* cited by examiner

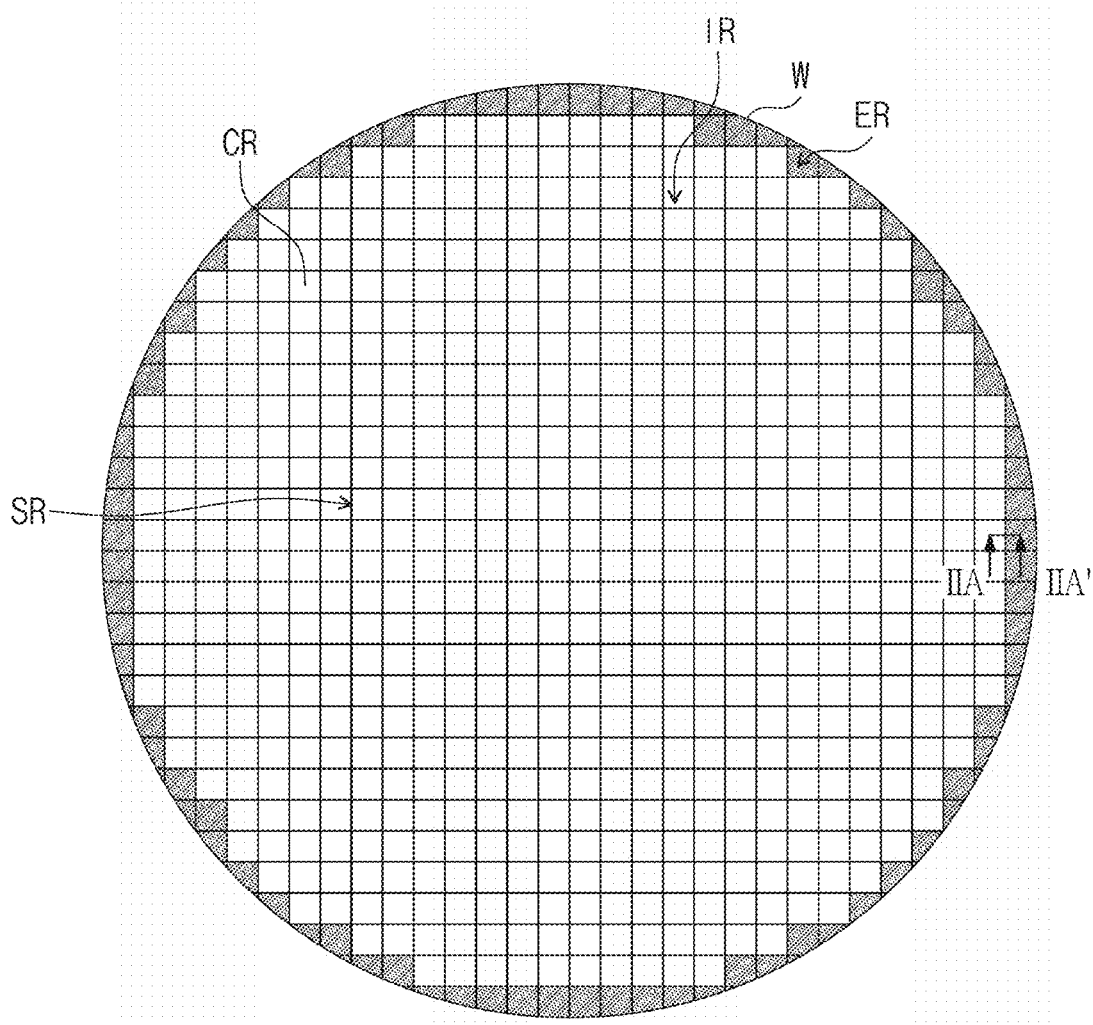

METHOD OF FABRICATING A SEMICONDUCTOR DEVICE

CROSS-REFERENCE TO RELATED APPLICATIONS

This U.S. non-provisional patent application claims priority under 35 U.S.C. § 119 to Korean Patent Application No. 10-2019-0100435, filed on Aug. 16, 2019, in the Korean Intellectual Property Office, the entire contents of which are hereby incorporated by reference.

BACKGROUND OF THE INVENTION

The present disclosure relates to methods of fabricating a semiconductor device.

Due to their small-sized, multifunctional, and/or low-cost characteristics, semiconductor devices are being regarded as important elements in the electronic industry. With the advancement of the electronic industry, there is an increasing demand for a semiconductor device with higher integration density. To increase the integration density of the semiconductor device, it is desirable to reduce linewidths of patterns constituting the semiconductor device. However, reducing the linewidths of the patterns needs novel and expensive exposure technologies, and thus it is difficult to increase the integration density of the semiconductor device. Accordingly, a variety of studies on new technology for increasing integration density of a semiconductor device are being actively conducted.

SUMMARY

Some example embodiments of the inventive concepts provide methods of increasing a production yield in a process of fabricating a semiconductor device.

According to an example embodiment of the inventive concepts, a method of fabricating a semiconductor device includes preparing a substrate including a wafer inner region and a wafer edge region, the wafer inner region including a chip region and a scribe lane region, sequentially stacking a mold layer and a supporting layer on the substrate, forming a first mask layer on the supporting layer, the first mask layer including a first stepped region on the wafer edge region, forming a step-difference compensation pattern on the first stepped region, forming a second mask pattern including openings, on the first mask layer and the step-difference compensation pattern, and sequentially etching the first mask layer, the supporting layer, and the mold layer using the second mask pattern as an etch mask to form a plurality of holes in at least the mold layer.

According to an example embodiment of the inventive concepts, a method of fabricating a semiconductor device includes preparing a substrate including a wafer inner region and a wafer edge region, sequentially stacking a mold layer and a supporting layer on the substrate, forming a first mask layer on the supporting layer, the first mask layer including a first stepped region on the wafer edge region, forming a step-difference compensation pattern to fill the first stepped region of the first mask layer and to expose a top surface of the first mask layer on the wafer inner region, forming a second mask pattern on the first mask layer and on the step-difference compensation pattern, the second mask pattern including openings, and sequentially etching the first mask layer, the supporting layer, and the mold layer using the second mask pattern as an etch mask to form a plurality of holes in at least the mold layer.

According to an example embodiment of the inventive concepts, a method of fabricating a semiconductor device includes preparing a substrate including a wafer inner region and a wafer edge region, the wafer inner region including a chip region and a scribe lane region, sequentially stacking a mold layer, a supporting layer, and a first mask layer on the substrate, removing a portion of the first mask layer on the wafer edge region to form a first stepped region in the first mask layer, forming a planarization mask layer on the first mask layer, the planarization mask layer filling the first stepped region, a top surface of the planarization mask layer having a same height in the wafer inner region and the wafer edge region, forming a second mask pattern with openings, on the planarization mask layer, and sequentially etching the planarization mask layer, the first mask layer, the supporting layer, and the mold layer using the second mask pattern as an etch mask to form holes in at least the mold layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 1 is a plan view of a wafer according to an example embodiment of the inventive concepts.

Figure 2A:
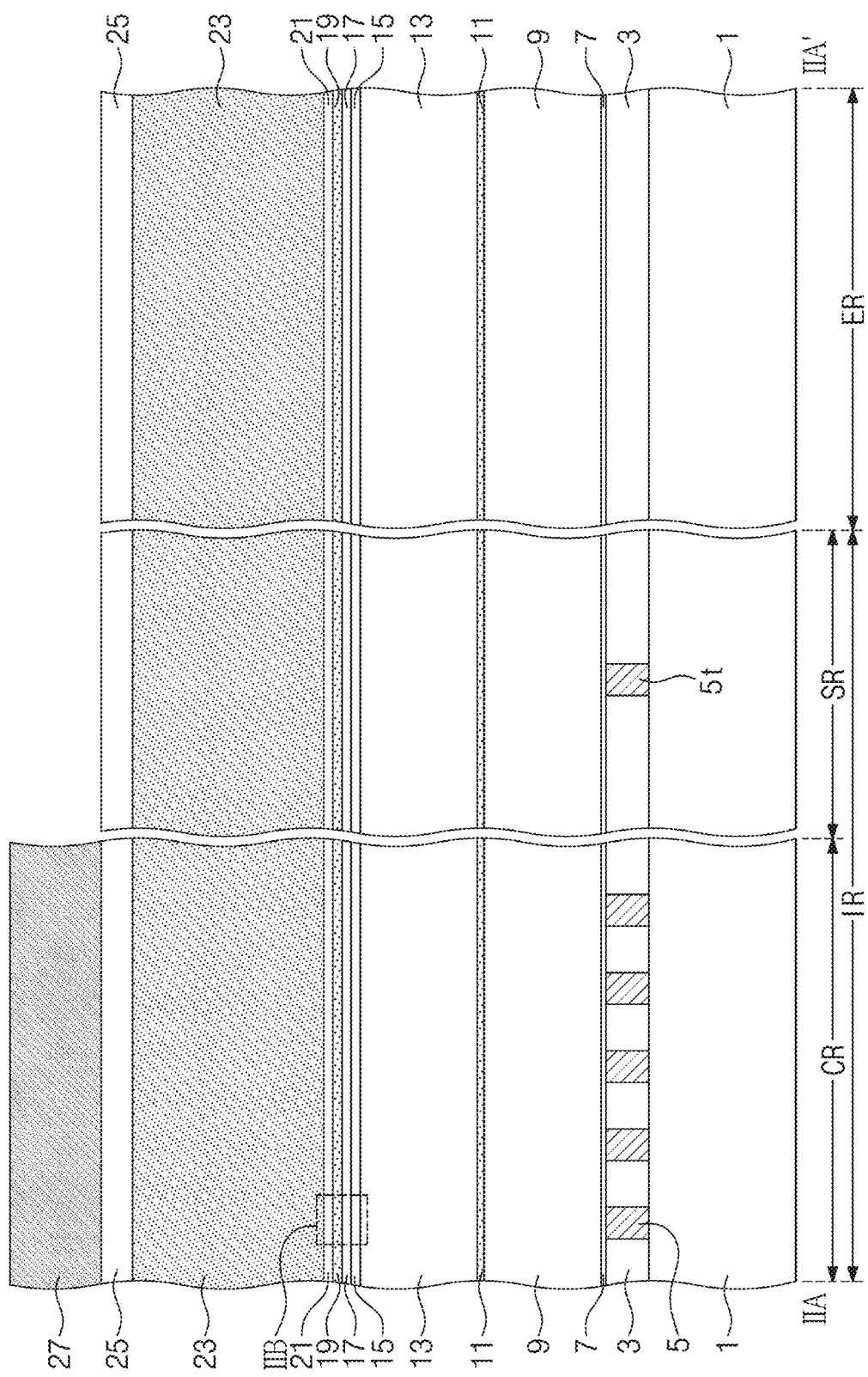
FIGS. 2A, 3 to 10, 11A, 12, 13, 14A, and 15 to 18 are cross-sectional views taken along a line IIA-IIA' to sequentially illustrate a process of fabricating a semiconductor device, according to an example embodiment of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given example embodiment, and should not be interpreted as defining or limiting the range of values or properties encompassed by the example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown.

As used herein, the term "and/or" includes any and all combinations of one or more of the associated listed items. Expressions such as "one of" or "at least one of," when preceding a list of elements, modify the entire list of elements and do not modify the individual elements of the list. Thus, for example, both "at least one of A, B, or C" and "A, B, and C" means either A, B, C or any combination thereof.

While the term "same" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

FIG. 1 is a plan view of a wafer according to an example embodiment of the inventive concepts.

Referring to FIG. 1, a wafer W according to an example embodiment of the inventive concepts may include a plurality of chip regions CR and a scribe lane region SR provided therebetween. The wafer W may include a wafer edge region ER and a wafer inner region IR. There may be a height difference between the wafer edge region ER and a top surface of a chuck, on which the wafer W is loaded, and such a height difference may lead to a defocus issue on the wafer edge region ER, when an exposure process is performed. Accordingly, it may be difficult to precisely form desired patterns on the chip regions CR, which are located in the wafer edge region ER. Thus, when a chip-sawing process is performed to divide the wafer W into semiconductor chips, the wafer edge region ER may be discarded, and only the chip regions CR in the wafer inner region IR may be used as semiconductor chips. If a failure pattern is formed in the wafer edge region ER, the failure pattern may serve as a particle source in a subsequent semiconductor fabrication process. Thus, it may be desirable to perform a process for suppressing patterns from being formed on the wafer edge region ER.

FIGS. 2A, 3 to 10, 11A, 12, 13, 14A, and 15 to 18 are cross-sectional views to sequentially illustrate a process of fabricating a semiconductor device, according to an example embodiment of the inventive concepts. Each of FIGS. 2A, 3 to 10, 11A, 12, 13, 14A, and 15 to 18 illustrates a vertical cross-section taken along a line IIA-IIA' of FIG. 1. FIG. 2B is an enlarged cross-sectional view of a portion 'IIB' of FIG. 2A. FIG. 11B is an enlarged cross-sectional view of a portion 'XIB' of FIG. 11A. FIG. 14B is a plan view illustrating a chip region of FIG. 14A. The chip region shown in FIG. 14A corresponds to a vertical cross-section taken along a line XIVA-XIVA' of FIG. 14B.

Figure 2B:
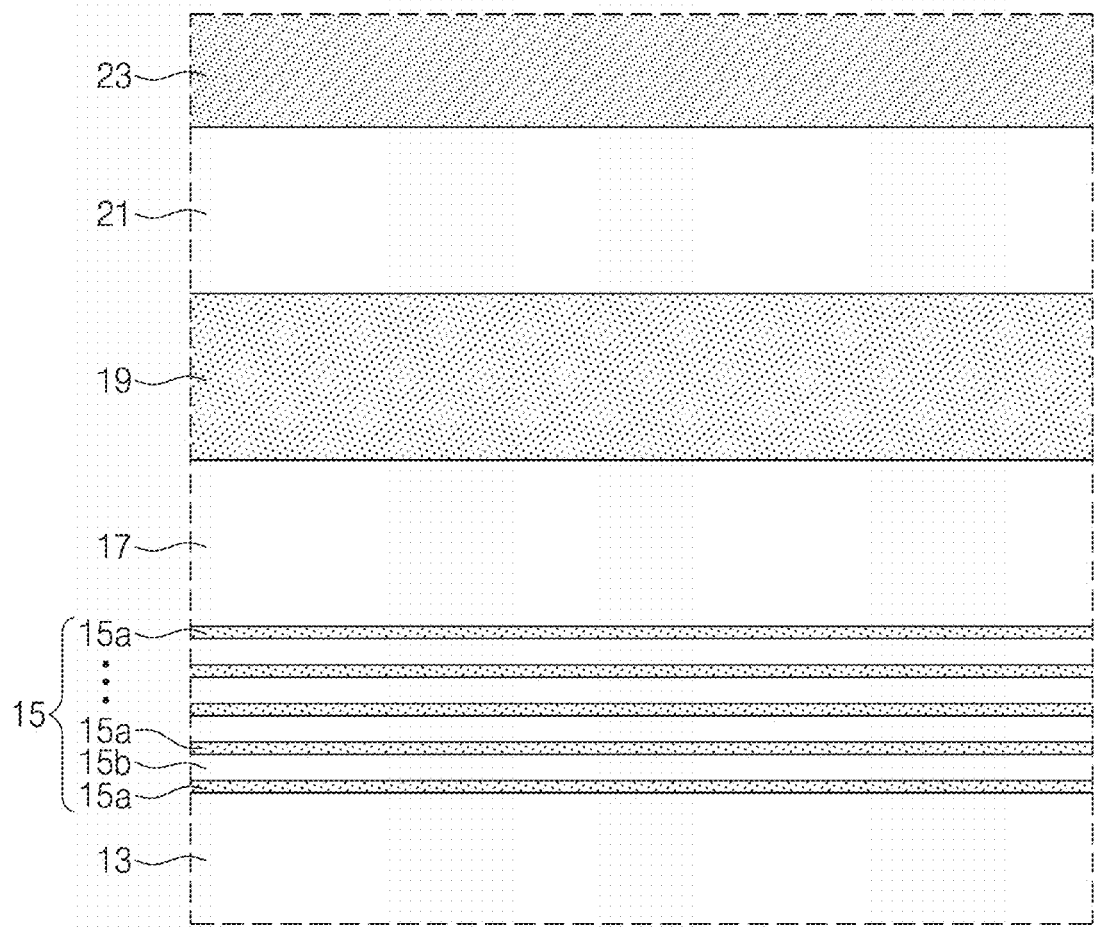
FIG. 2B is an enlarged cross-sectional view of a portion' 'IIB' of FIG. 2A.

Referring to FIGS. 2A and 2B, a semiconductor substrate 1 may be provided. The semiconductor substrate 1 may correspond to a portion of the wafer W. The semiconductor substrate 1 may include the wafer edge region ER and the wafer inner region IR. The chip region CR and the scribe lane region SR may be provided in the wafer inner region IR. The semiconductor substrate 1 may be, for example, a single-crystalline silicon wafer. An interlayered insulating layer 3 may be disposed on the semiconductor substrate 1. The interlayered insulating layer 3 may be formed of, for example, silicon oxide. A plurality of lower electrode contacts 5 may be disposed on the chip region CR to penetrate the interlayered insulating layer 3 and to be electrically connected to the semiconductor substrate 1. The lower electrode contacts 5 may be formed of or include at least one of, for example, doped polysilicon pattern, titanium nitride, or tungsten. A test conductive pattern 5t may be disposed on the scribe lane region SR of the semiconductor substrate 1. The test conductive pattern 5t may be formed of or include the same material as the lower electrode contacts 5.

Although not shown, a device isolation layer may be disposed in the chip region CR of the semiconductor substrate 1 to define active regions. Word lines may be buried in the semiconductor substrate 1. The word lines may be electrically disconnected from the semiconductor substrate 1 by a gate insulating layer and a capping pattern. Impurity injection regions, which serve as source/drain regions, may be disposed in portions of the semiconductor substrate 1 at both sides of the word lines. The impurity injection regions, which are placed at one side of the word lines, may be electrically connected to bit lines, respectively. The lower electrode contacts 5 may be electrically connected to the impurity injection regions, which are placed at the opposite side of the word lines.

A first etch stop layer 7 may be formed on the interlayered insulating layer 3. The first etch stop layer 7 may be formed of a material (e.g., silicon nitride) having an etch selectivity with respect to the interlayered insulating layer 3. A first mold layer 9, a first supporting layer 11, a second mold layer 13, a first bowing suppressing layer 15, a second bowing suppressing layer 17, a second supporting layer 19, a second etch stop layer 21, a first mask layer 23, and a second mask layer 25 may be sequentially stacked on the first etch stop layer 7. The first mold layer 9 and the second mold layer 13 may be formed of a material having an etch selectivity with respect to the first supporting layer 11 and the second supporting layer 19. The first mold layer 9 and the second mold layer 13 may be formed of or include, for example, silicon oxide. The first supporting layer 11 and the second supporting layer 19 may be formed of or include, for example, silicon carbon nitride. The second etch stop layer 21 may be formed of or include, for example, silicon nitride.

The first bowing suppressing layer 15 may include first sub-bowing suppressing layers 15a and second sub-bowing suppressing layers 15b, which are alternatingly stacked. The first sub-bowing suppressing layers 15a may be formed of or include the same material (e.g., silicon nitride) as the second etch stop layer 21. The second sub-bowing suppressing layers 15b may be formed of or include the same material (e.g., silicon oxide) as the first and second mold layers 9 and 13. Each of the second sub-bowing suppressing layers 15b may be thicker than each of the first sub-bowing suppressing layers 15a. In some example embodiments, the second bowing suppressing layer 17 may be formed of or include a material, which has an etch selectivity with respect to all of the second supporting layer 19 and the first and second mold layers 9 and 13. The second bowing suppressing layer 17 may include, for example, a boron-doped silicon nitride layer.

The first mask layer 23 may be formed of or include a material, which has an etch selectivity with respect to the first mold layer 9, the first supporting layer 11, the second mold layer 13, the first bowing suppressing layer 15, the second bowing suppressing layer 17, the second supporting layer 19, and the second etch stop layer 21. The first mask layer 23 may be formed of or include, for example, polysilicon. The second mask layer 25 may be formed of or include a material having an etch selectivity with respect to the first mask layer 23. The second mask layer 25 may be formed of or include, for example, silicon oxide or silicon nitride.

In the chip region CR, a first photoresist pattern 27 may be formed on the second mask layer 25. The first photoresist pattern 27 may be provided to expose a top surface of the second mask layer 25, in the wafer edge region ER and the scribe lane region SR adjacent thereto. The first photoresist pattern 27 may be formed by a photolithography process.

Figure 3:
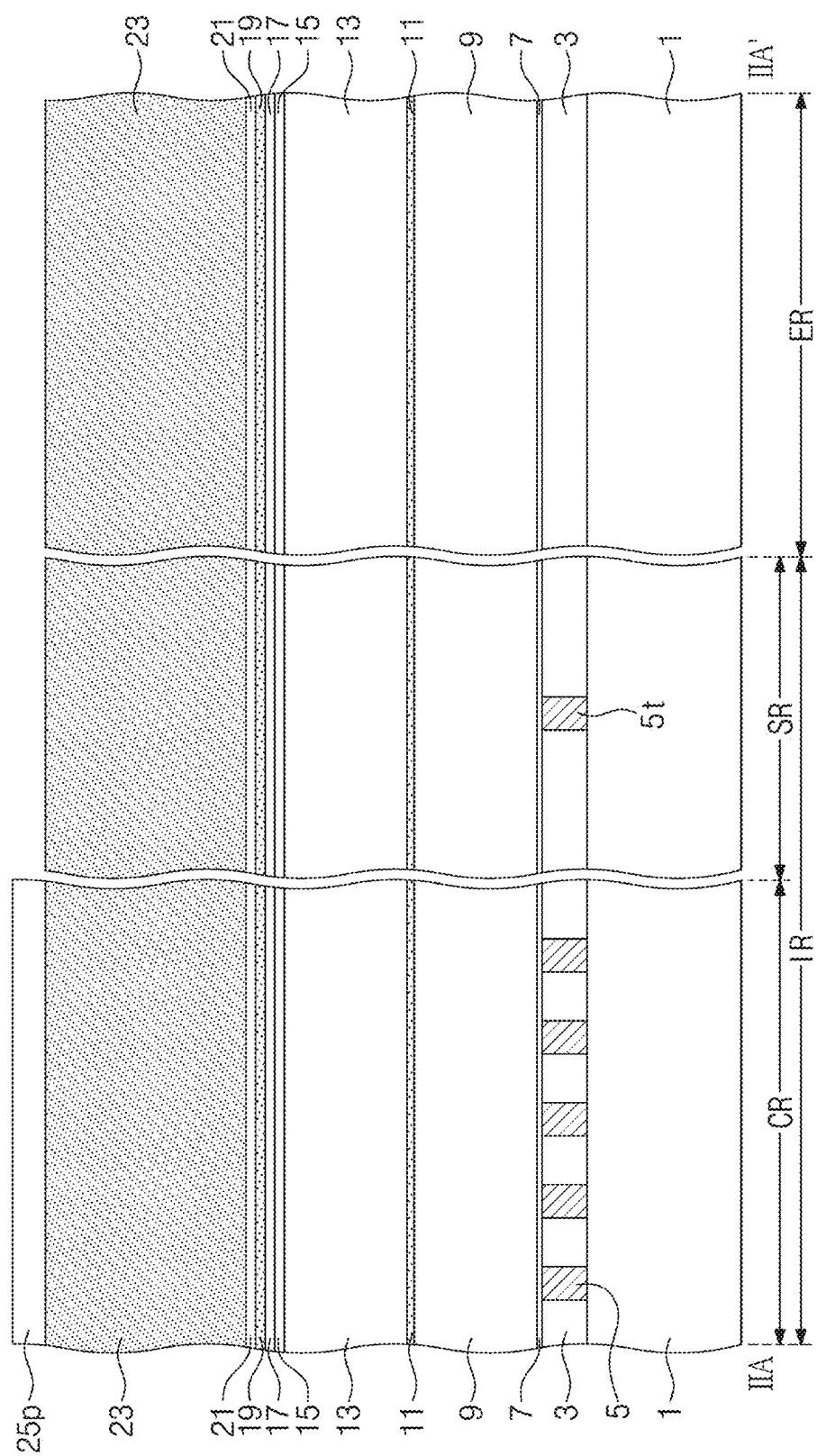

Referring to FIGS. 2A and 3, a second mask pattern 25p may be formed by etching the second mask layer 25 using the first photoresist pattern 27 as an etch mask. In the wafer edge region ER and the scribe lane region SR adjacent thereto, the second mask pattern 25p may expose a top surface of the first mask layer 23.

Figure 4:
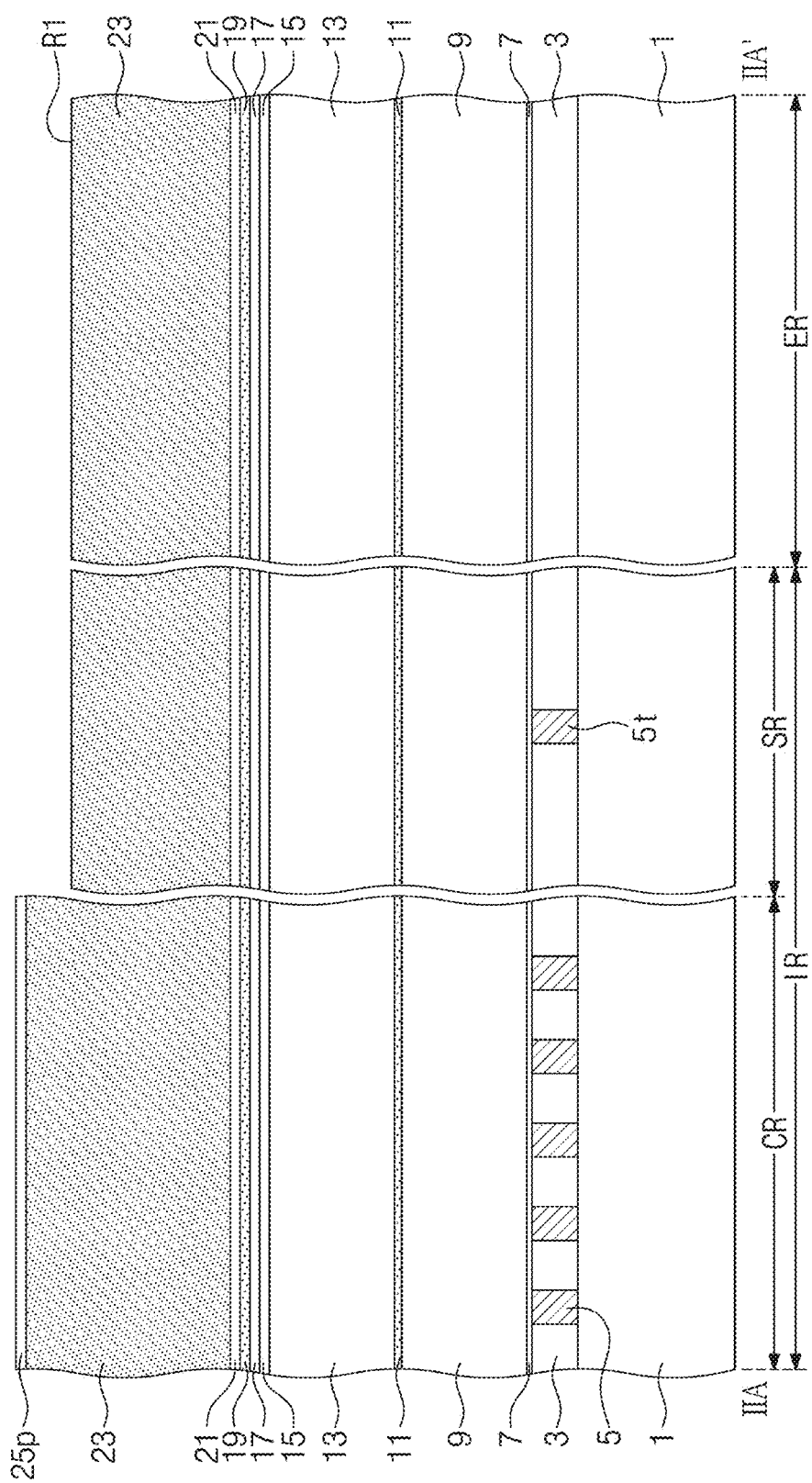

Referring to FIGS. 3 and 4, a first recess region R1 may be formed by etching an upper portion of the first mask layer 23 using the second mask pattern 25p as an etch mask. Accordingly, the first mask layer 23 may be thinner in the wafer edge region ER and the scribe lane region SR adjacent thereto than in the chip region CR. A thickness of the second mask pattern 25p may also be reduced by the etching process.

Figure 5:
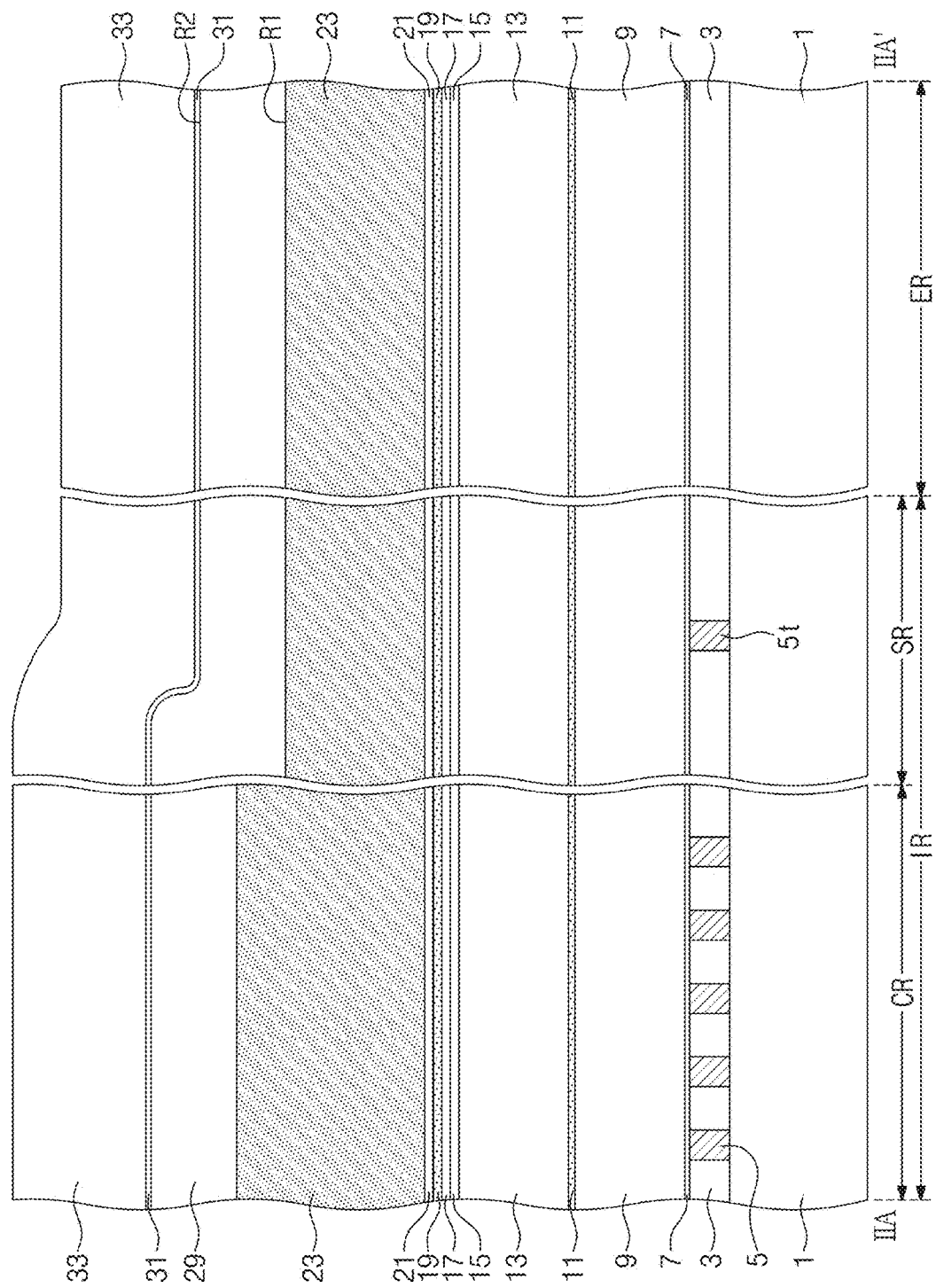

Referring to FIGS. 4 and 5, the second mask pattern 25p may be removed, and then, a third mask layer 29, a polishing stop layer 31, and a fourth mask layer 33 may be sequentially and conformally formed by performing a deposition process (e.g., chemical vapor deposition (CVD), atomic layer deposition (ALD), and physical vapor deposition (PVD) processes). The fourth mask layer 33 may be referred to as a step-difference compensation layer. The third mask layer 29 and the fourth mask layer 33 may be formed of or include the same material (e.g., silicon oxide). The polishing stop layer 31 may be formed of a material, which has a polishing selectivity or etch selectivity with respect to the third mask layer 29 and the fourth mask layer 33. The polishing stop layer 31 may be formed of or include a material (e.g., silicon nitride), which is different from the third mask layer 29 and the fourth mask layer 33. The third mask layer 29 may fill the first recess region R1. Because the third mask layer 29 is conformally formed, a top surface of the third mask layer 29 may have a second recess region R2, which is formed through transcription of the first recess region R1 of the first mask layer 23, in the wafer edge region ER and the scribe lane region SR adjacent thereto. The fourth mask layer 33 may fill the second recess region R2.

Figure 6:
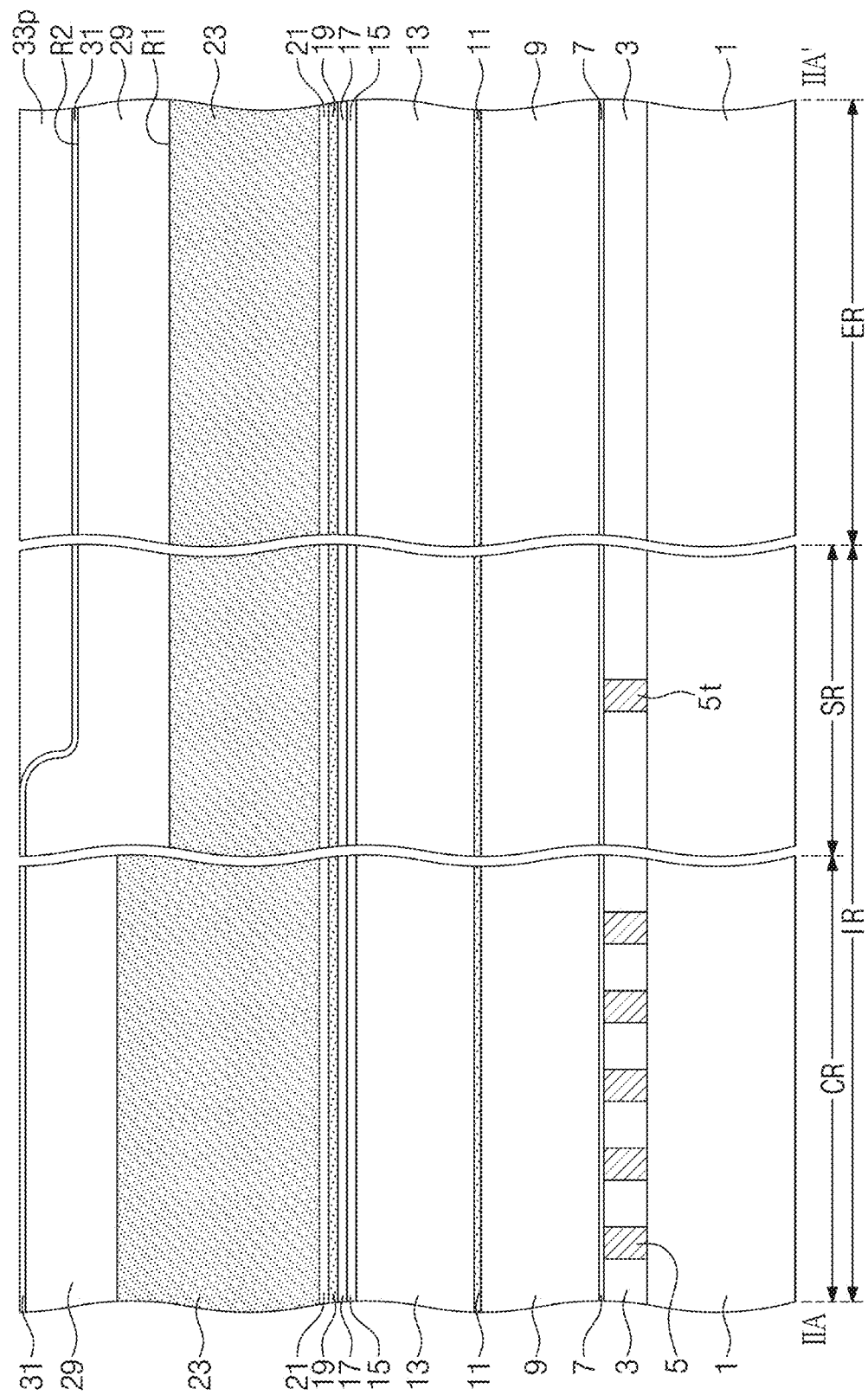

Referring to FIGS. 5 and 6, a chemical mechanical polishing (CMP) process may remove the fourth mask layer 33 from the chip region CR and to expose the polishing stop layer 31 on the chip region CR. Accordingly, a portion of the fourth mask layer 33 may be removed from the wafer edge region ER and the scribe lane region SR adjacent thereto, such that a fourth mask pattern 33p is formed to fill the second recess region R2. Due to the presence of the fourth mask pattern 33p, a height difference between the wafer edge region ER and the chip region CR may be reduced or removed. For this reason, the fourth mask pattern 33p also may be referred to as a step-difference compensation pattern.

Figure 7:
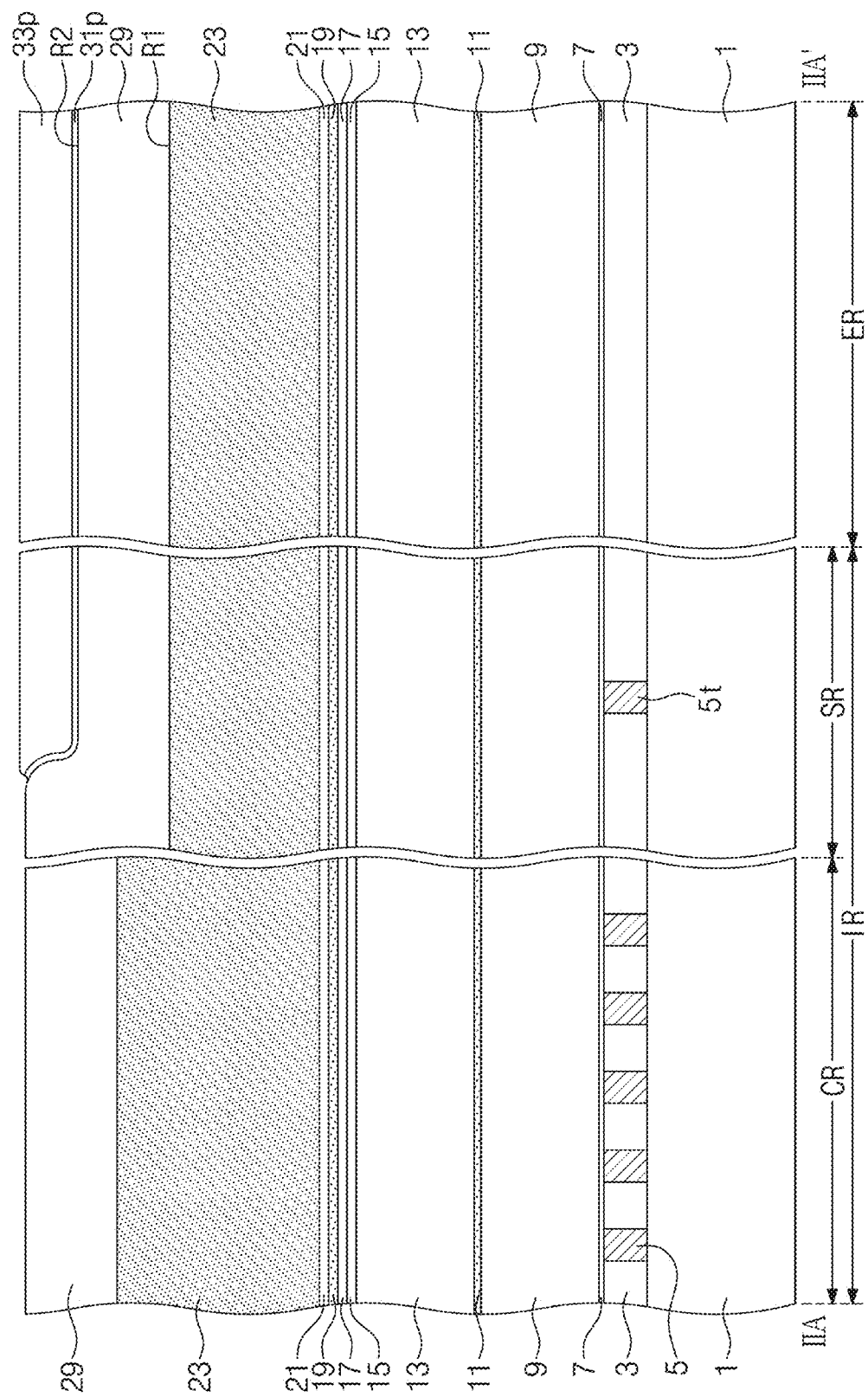

Referring to FIGS. 6 and 7, the exposed portion of the polishing stop layer 31, which is not covered with the fourth mask pattern 33p, may be removed to expose a top surface of the third mask layer 29 on the chip region CR. In this case, on the wafer edge region ER and the scribe lane region SR adjacent thereto, a polishing stop pattern 31p may be left between the third mask layer 29 and the fourth mask pattern 33p. In an example embodiment, an isotropic etching process may remove the polishing stop layer 31 from the chip region CR. The first recess region R1 may have a first depth D1, and the fourth mask pattern 33p may have a first thickness T1. In an example embodiment, the first depth D1 may be the same as or substantially similar to the first thickness T1.

Figure 8:
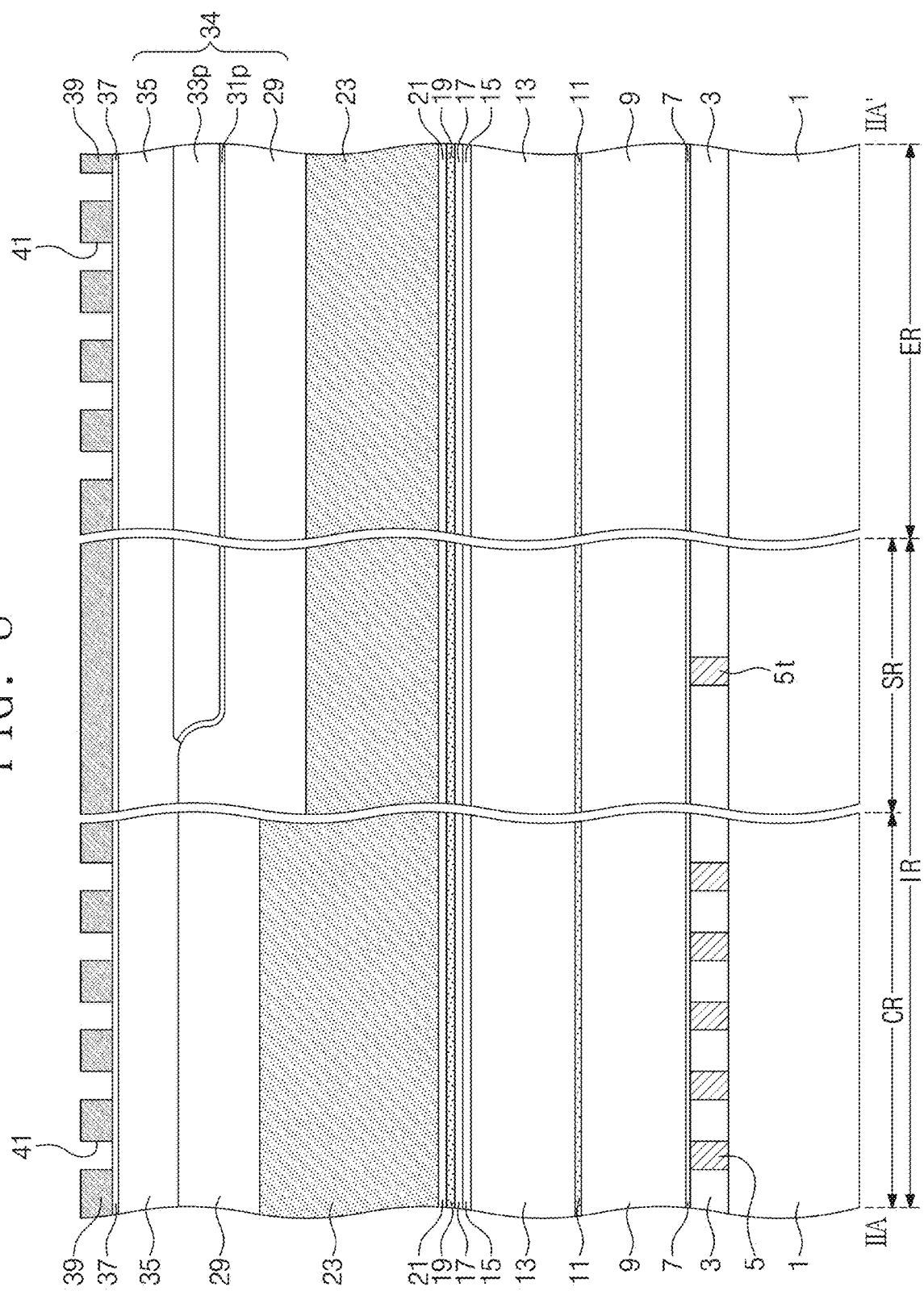

Referring to FIGS. 7 and 8, an auxiliary planarization layer 35 may be formed on the third mask layer 29 and the fourth mask pattern 33p. The auxiliary planarization layer 35 may be formed by, for example, a spin coating method and may be formed of at least one of spin-on-hardmask (SOH) or spin-on-carbon (SOC) materials. The third mask layer 29, the polishing stop pattern 31p, the fourth mask pattern 33p, and the auxiliary planarization layer 35 may collectively constitute a planarization mask layer 34. A height of a top surface of the planarization mask layer 34 may be the same or substantially constant, regardless of the position on the substrate 1. Due to the fourth mask pattern 33p, the planarization mask layer 34 may be thicker in the wafer edge region ER than in the chip region CR.

A fifth mask layer 37 may be formed on the planarization mask layer 34. The fifth mask layer 37 may be formed of or include a material having an etch selectivity with respect to the auxiliary planarization layer 35. For example, the fifth mask layer 37 may include a silicon nitride layer, a silicon oxynitride layer, or a silicon oxide layer. The fifth mask layer 37 may serve as an anti-reflection layer. A second photoresist pattern 39 may be formed on the fifth mask layer 37. The second photoresist pattern 39 may be formed by a photolithography process. The second photoresist pattern 39 may include first openings 41, which will be used to delimit or define lower electrode holes. The first openings 41 may be formed not only on the chip region CR of the wafer inner region IR but also on the wafer edge region ER.

Figure 9:
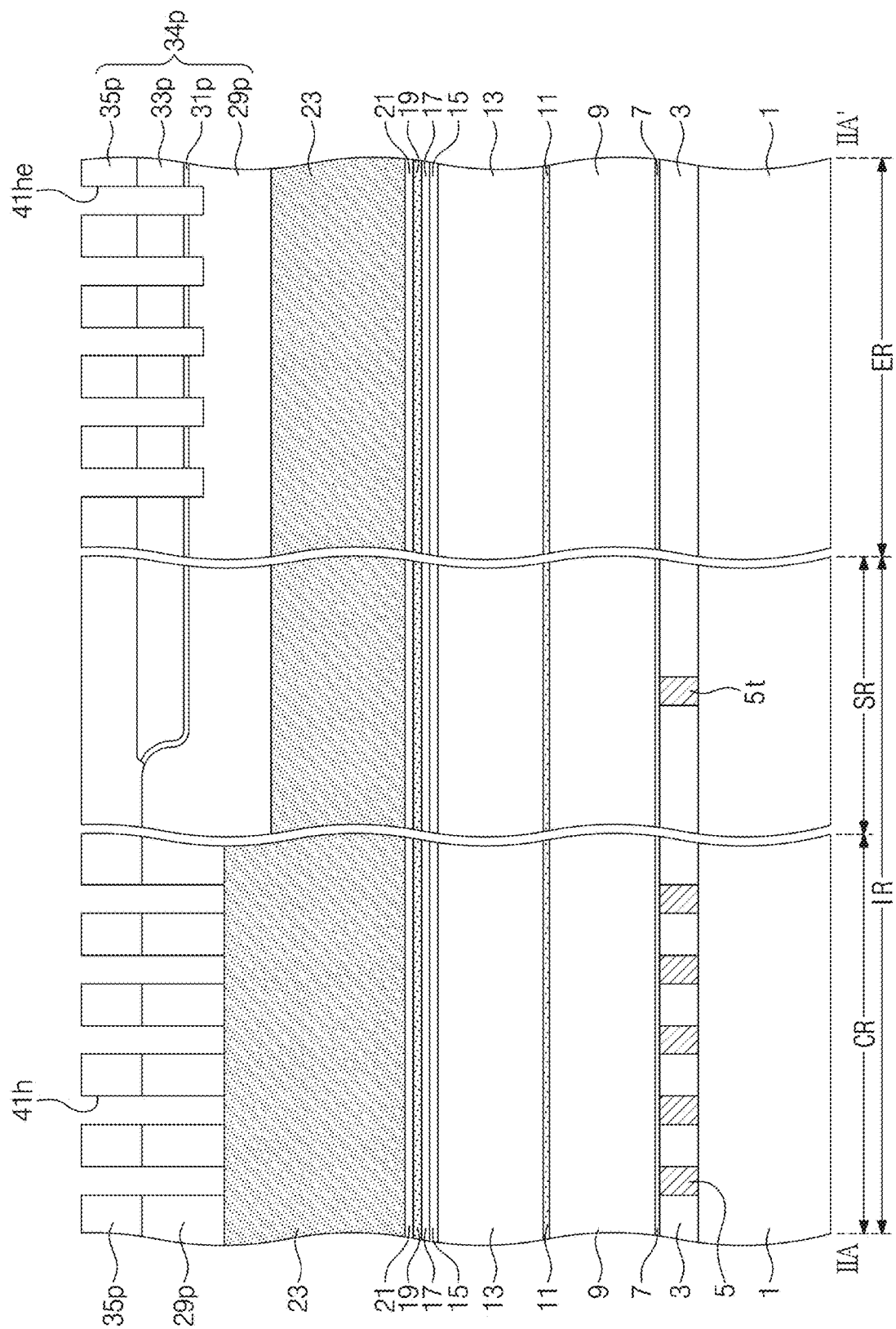

Referring to FIGS. 8 and 9, an anisotropic etching process using the second photoresist pattern 39 as an etch mask may sequentially etch the fifth mask layer 37 and the planarization mask layer 34 to form a planarization mask pattern 34p including first holes 41h. The first holes 41h may be formed to expose the top surface of the first mask layer 23 in the chip region CR. When the first holes 41h are formed, first edge holes 41he may also be formed on the wafer edge region ER. The first edge holes 41he may not expose the first mask layer 23. The planarization mask pattern 34p may include a third mask pattern 29p and an auxiliary planarization pattern 35p. The planarization mask pattern 34p may further include the polishing stop pattern 31p and the fourth mask pattern 33p, which are disposed between the third mask pattern 29p and the auxiliary planarization pattern 35p and on the wafer edge region ER and the scribe lane region SR adjacent thereto. Because the polishing stop pattern 31p is used as an etch stop layer during the etching process, a depth of the first edge holes 41he may be smaller than a depth of the first holes 41h.

Figure 10:
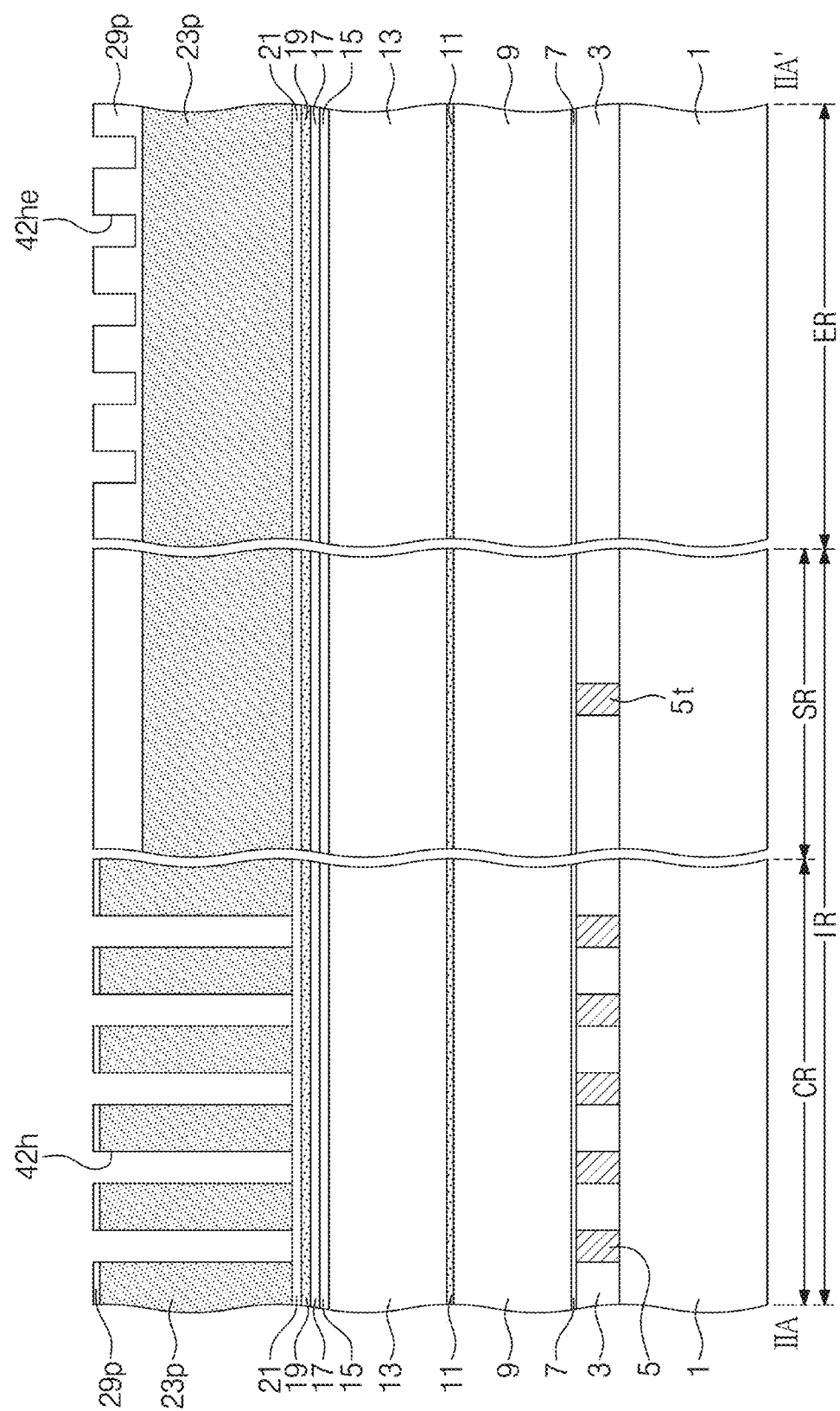

Referring to FIGS. 9 and 10, an anisotropic etching process using the planarization mask pattern 34p as an etch mask may etch the first mask layer 23 to form a first mask pattern 23p including second holes 42h. The second holes 42h, which are formed through the transcription of the first holes 41h, may expose the second etch stop layer 21. The planarization mask pattern 34p may be etched and thinned, during the etching process. Accordingly, only a portion of the third mask pattern 29p may be left on the first mask pattern 23p. Second edge holes 42he may be formed in the third mask pattern 29p. The second edge holes 42he, which are formed through the transcription of the first edge holes 41he, may not expose the first mask pattern 23p.

Figure 11A:
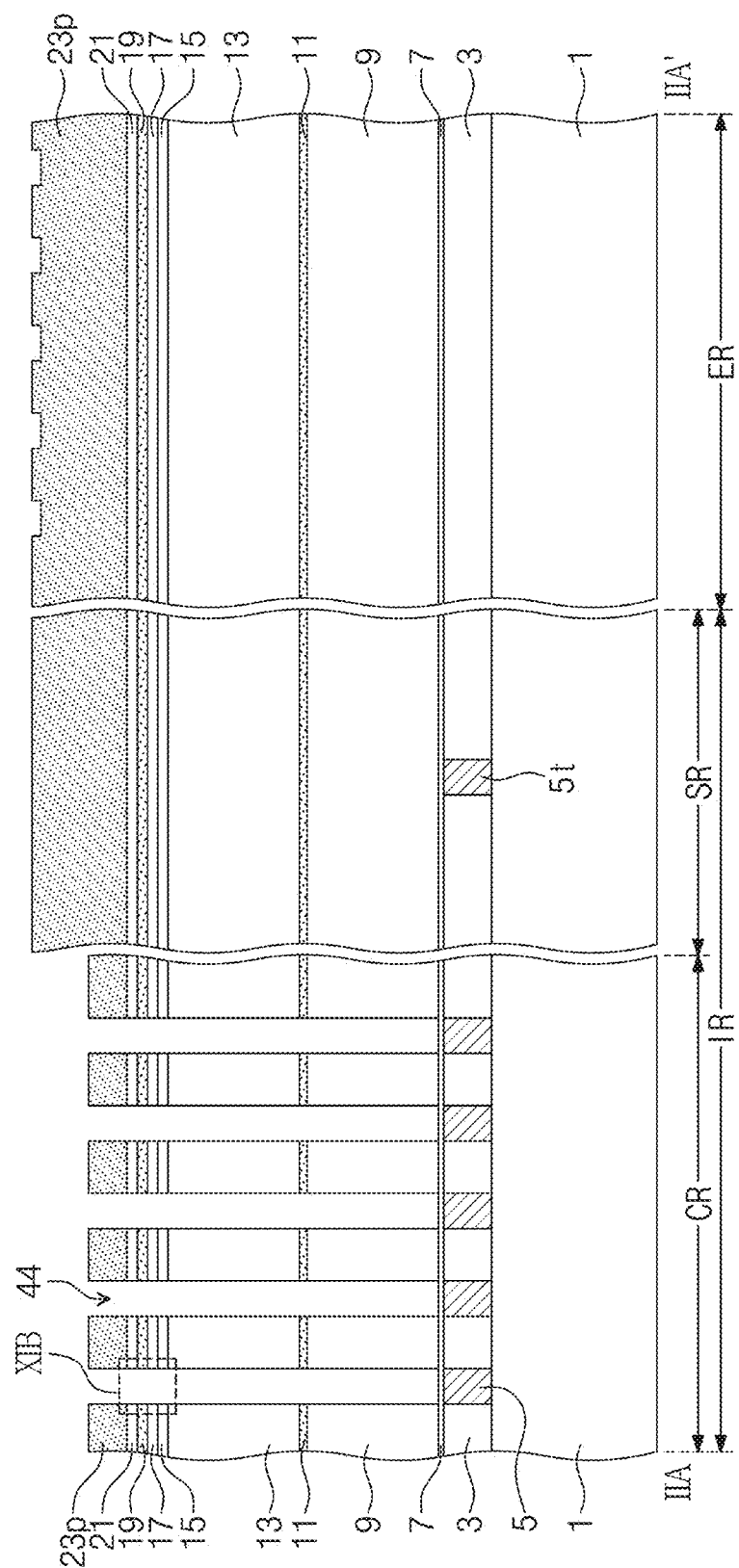
Figure 11B:
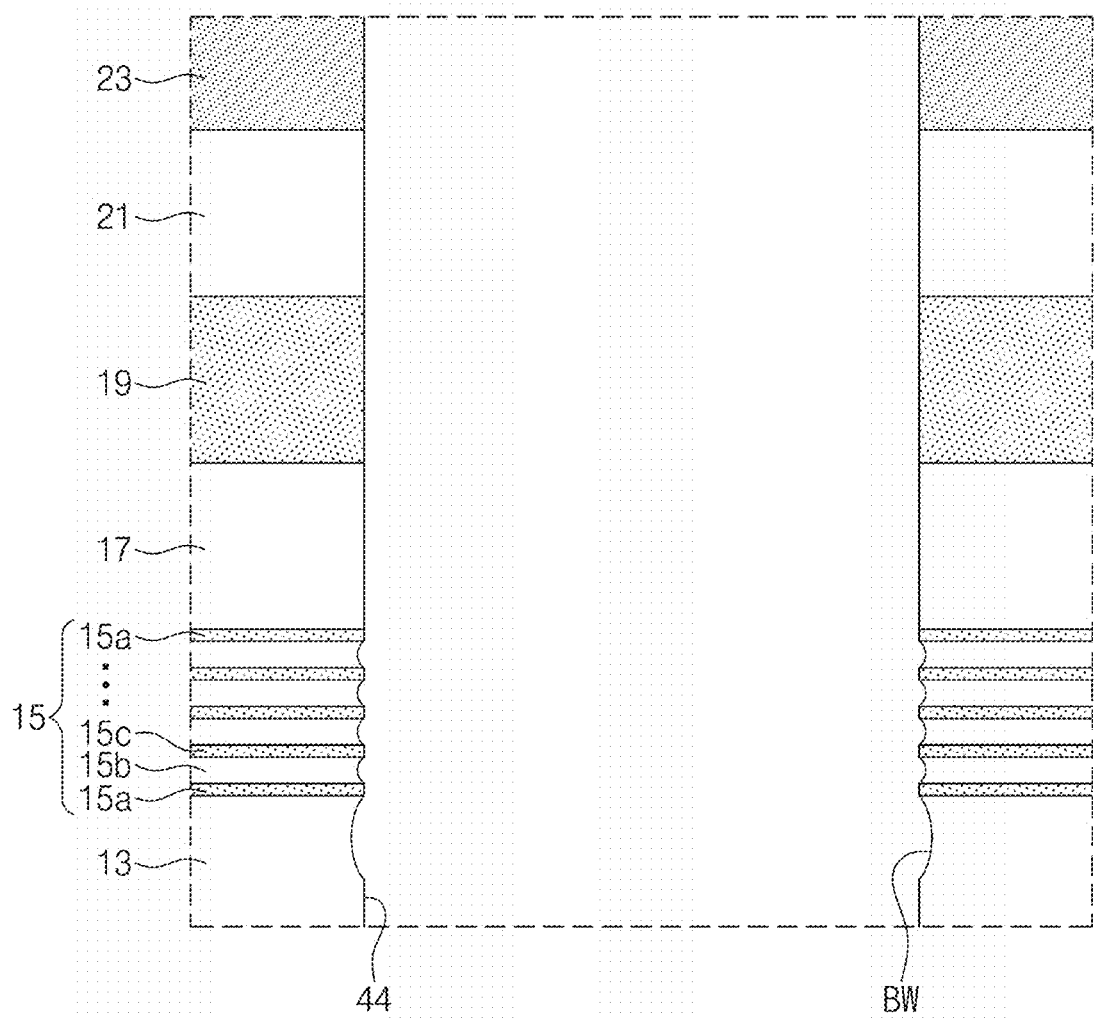
FIG. 11B is an enlarged cross-sectional view of a portion 'XIB' of FIG. 11A.

Referring to FIGS. 10, 11A, and 11B, an anisotropic etching process using the first mask pattern 23p as an etch mask may sequentially etch the second etch stop layer 21, the second supporting layer 19, the second bowing suppressing layer 17, the first bowing suppressing layer 15, the second mold layer 13, the first supporting layer 11, and the first mold layer 9 such that a lower electrode hole 44 is formed on the chip region CR to expose the first etch stop layer 7. When the lower electrode hole 44 is formed, an upper portion of the second mold layer 13 may be exposed to an etchant for a long time. Thus, a bowing phenomenon that an upper portion of the second lower electrode hole 44 is enlarged may occur. If the bowing phenomenon is deepened, a bridge issue (e.g., that lower electrodes 43 to be formed later by filling the lower electrode holes 44 are connected to each other) may occur, or forming a dielectric layer and an upper electrode layer in a subsequent process may become difficult.

However, in an example embodiment of the inventive concepts, the second bowing suppressing layer 17 may be formed of a material (e.g., a boron-doped silicon nitride layer) different from the second mold layer 13, as described with reference to FIG. 11B. For example, the second bowing suppressing layer 17 may have an etch selectivity with respect to the second mold layer 13. Thus, the bowing phenomenon may not occur in the second bowing suppressing layer 17, when the lower electrode hole 44 is formed. In addition, a height of a bowing region BW may be lowered by the thickness of the second bowing suppressing layer 17.

Furthermore, because the first bowing suppressing layer 15 is composed of the first sub-bowing suppressing layers 15a and the second sub-bowing suppressing layers 15b, which are alternately stacked, it may be possible to disperse an etchant or to suppress the etchant from being concentrated in an upper portion of the second mold layer 13. Accordingly, it may be possible to suppress the bowing region BW from being formed in the upper portion of the second mold layer 13.

Referring to FIGS. 10 and 11A, due to the third mask pattern 29p on the wafer edge region ER and the scribe lane region SR adjacent thereto, the etching of the first mask pattern 23p may be delayed, when the lower electrode holes 44 are formed in the mold layer (e.g., the first mold layer 9 and the second mold layer 13) on the chip region CR of the wafer W. Accordingly, on the wafer edge region ER and the scribe lane region SR adjacent thereto, a considerable portion of the first mask pattern 23p may be left to cover the second etch stop layer 21. The lower electrode holes 44 may not be formed on the wafer edge region ER and the scribe lane region SR adjacent thereto.

Figure 12:
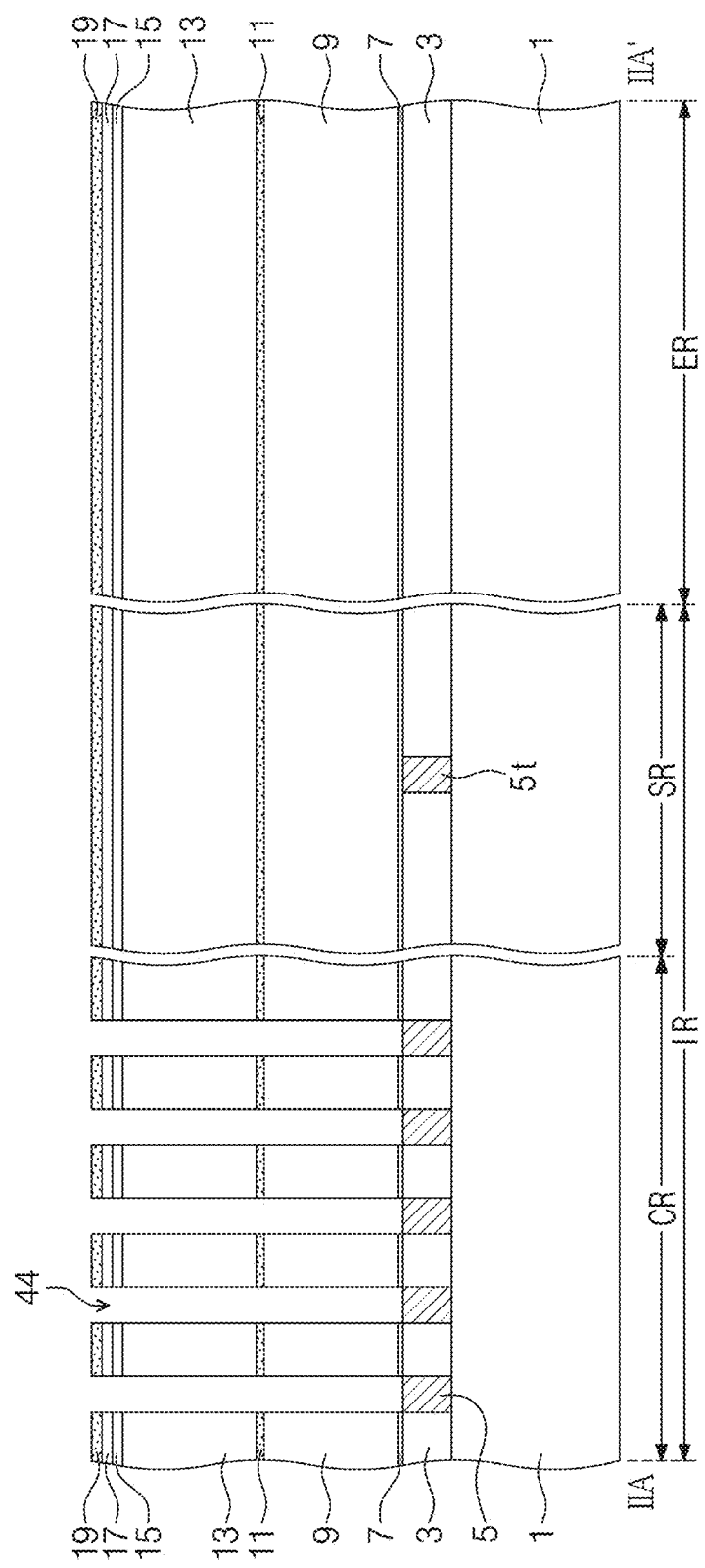

Referring to FIGS. 11A and 12, an isotropic etching process may remove the first mask pattern 23p, and in this case, it may be possible to expose the second etch stop layer 21, without damage. The first etch stop layer 7, which is exposed through the lower electrode holes 44, may be removed to expose the lower electrode contacts 5. Because the second etch stop layer 21 is formed of the same material as the first etch stop layer 7, the second etch stop layer 21 may also be removed, when the first etch stop layer 7 is removed, and thus, the top surface of the second supporting layer 19 may be exposed.

Figure 13:
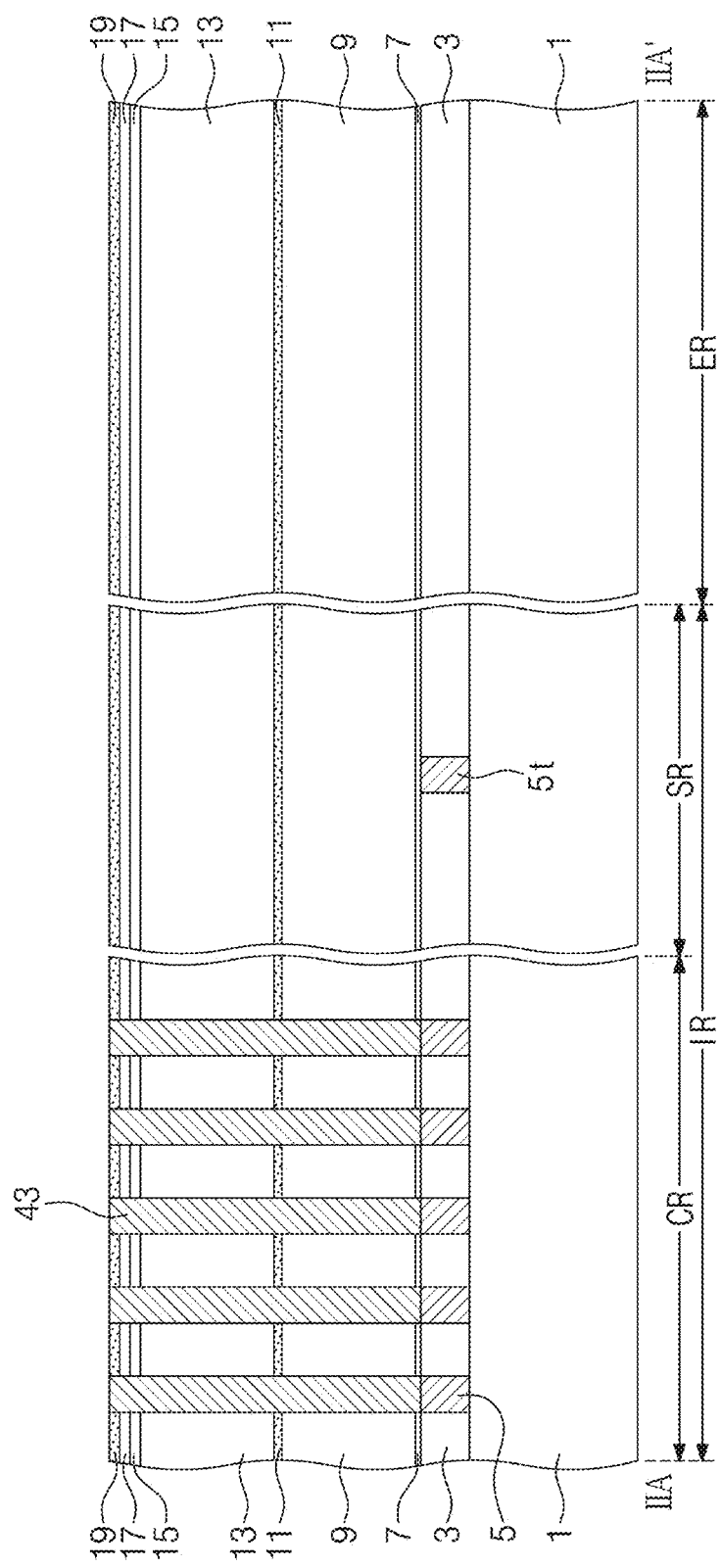

Referring to FIG. 13, a conductive layer may be formed on the semiconductor substrate 1, and then a CMP or etch-back process may be performed to form the lower electrodes 43 in the lower electrode holes 44, respectively, and to expose a top surface of the second supporting layer 19. The lower electrodes 43 may be formed of or include at least one of doped poly-silicon, metal nitrides (e.g., titanium nitride), or metals (e.g., tungsten). The lower electrodes 43 may be referred to as a conductive pillar. The lower electrodes 43 may have, for example, a plug shape, a hollow cylinder shape, or a cup shape.

Figure 14A:
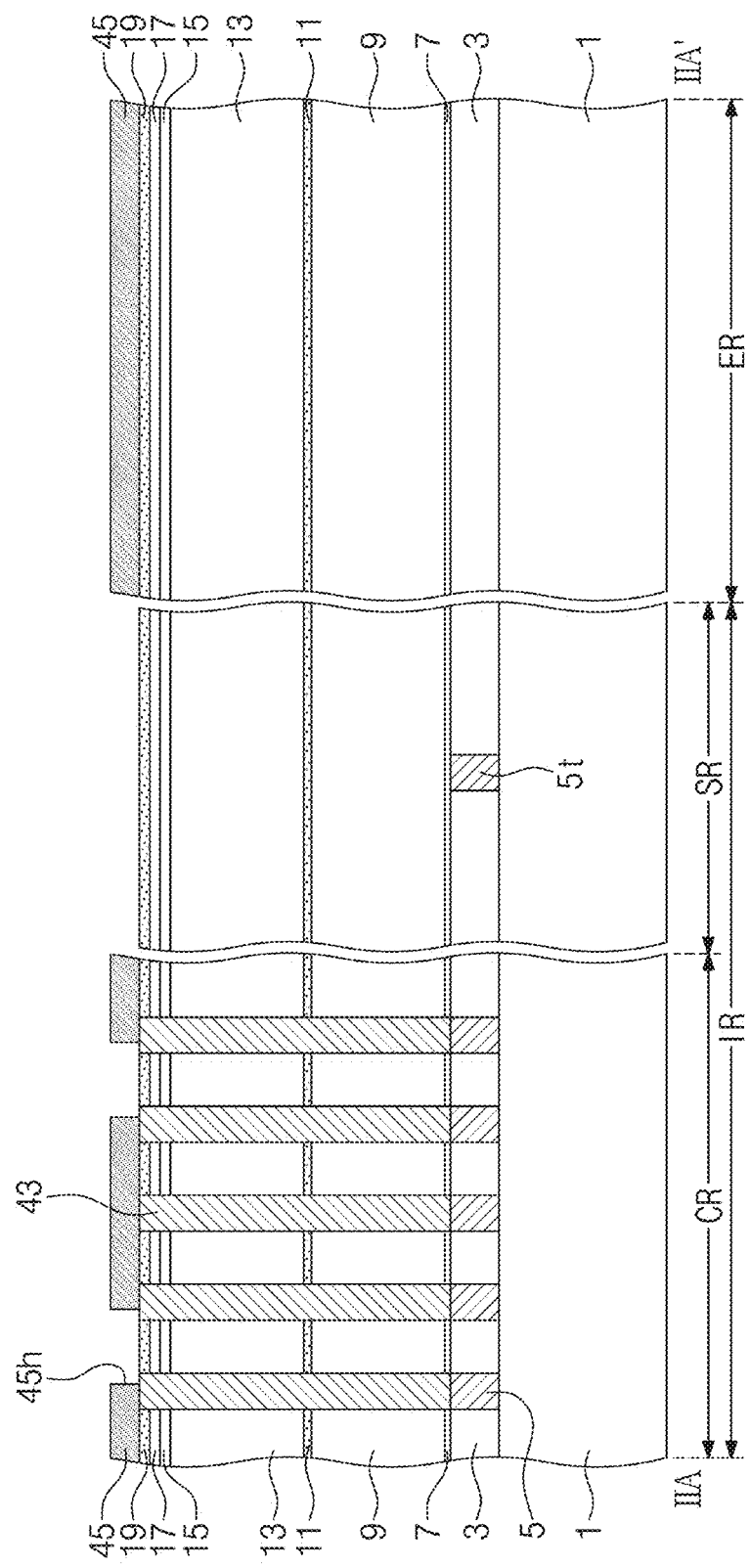
Figure 14B:
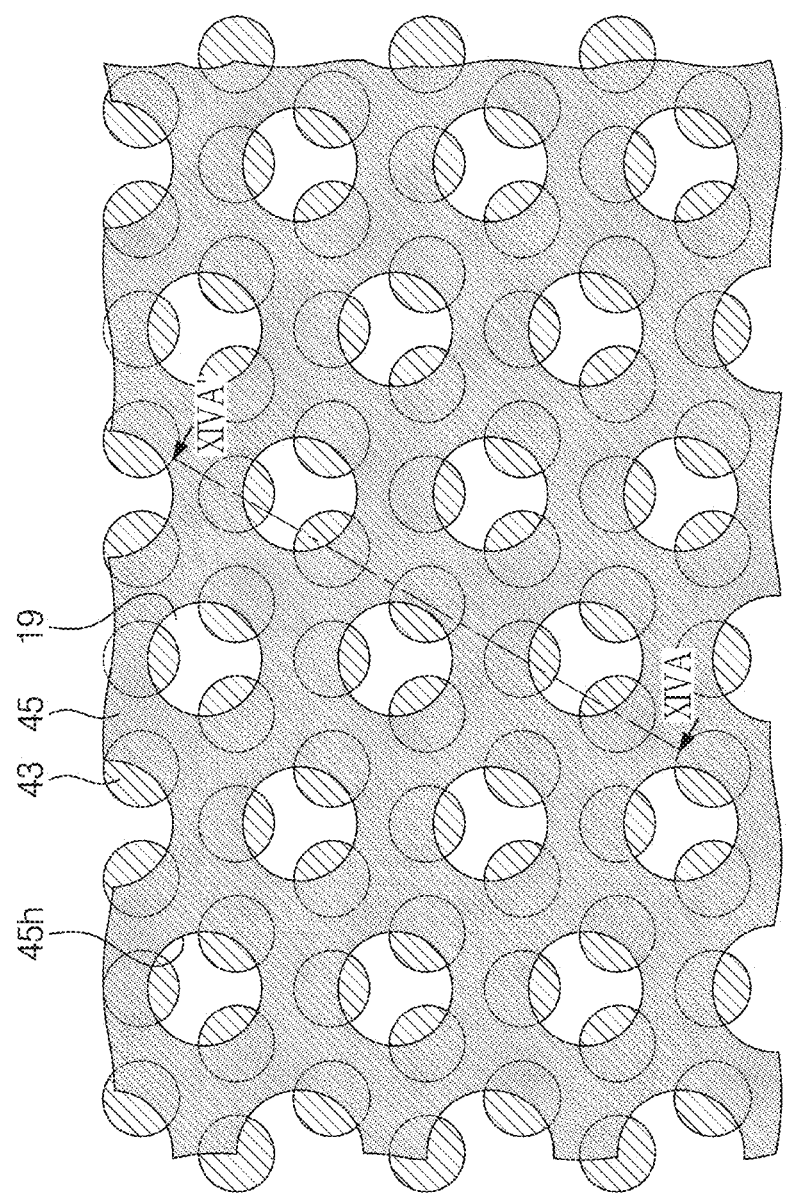
FIG. 14B is a plan view illustrating a chip region of FIG. 14A. The chip region shown in FIG. 14A also corresponds to a vertical cross-section taken along a line XIVA-XIVA' of FIG. 14B.

Referring to FIGS. 13, 14A, and 14B, a sixth mask pattern 45 may be formed on the second supporting layer 19. The sixth mask pattern 45 may include a photoresist pattern, a spin-on-hardmask (SOH) material, a spin-on-carbon (SOC) material, or an amorphous carbon layer (ACL). On the chip region CR, the sixth mask pattern 45 may have second openings 45h, which partially expose the lower electrodes 43. The second openings 45h may have a circular shape, when viewed in a plan view, and may expose three adjacent ones of the lower electrodes 43 and the second supporting layer 19 therebetween.

The second openings 45h may be the same as each other in terms of their shape and a distance therebetween. Side surfaces of all of the lower electrodes 43 may be partially exposed through the second openings 45h. In some example embodiments, the areas of the exposed side surfaces of the lower electrodes 43 may be the same. Thus, it may be possible to reduce or suppress a loading effect in a subsequent process of removing the first and second mold layers 9 and 13 or of depositing a dielectric layer 47 and an upper electrode layer 49 and to reduce a spatial variation of the process state or condition. Accordingly, it may be possible to mitigate or prevent portions of the lower electrodes 43 from being excessively damaged in the process of removing the first and second mold layers 9 and 13. Furthermore, each of the dielectric layer 47 and the upper electrode layer 49 may be formed in the subsequent process to have a constant thickness throughout the semiconductor substrate 1.

The sixth mask pattern 45 may not be formed on the scribe lane region SR. Thus, the second supporting layer 19 may be exposed on the scribe lane region SR. On the wafer edge region ER, the top surface of the second supporting layer 19 may be covered with the sixth mask pattern 45.

Figure 15:
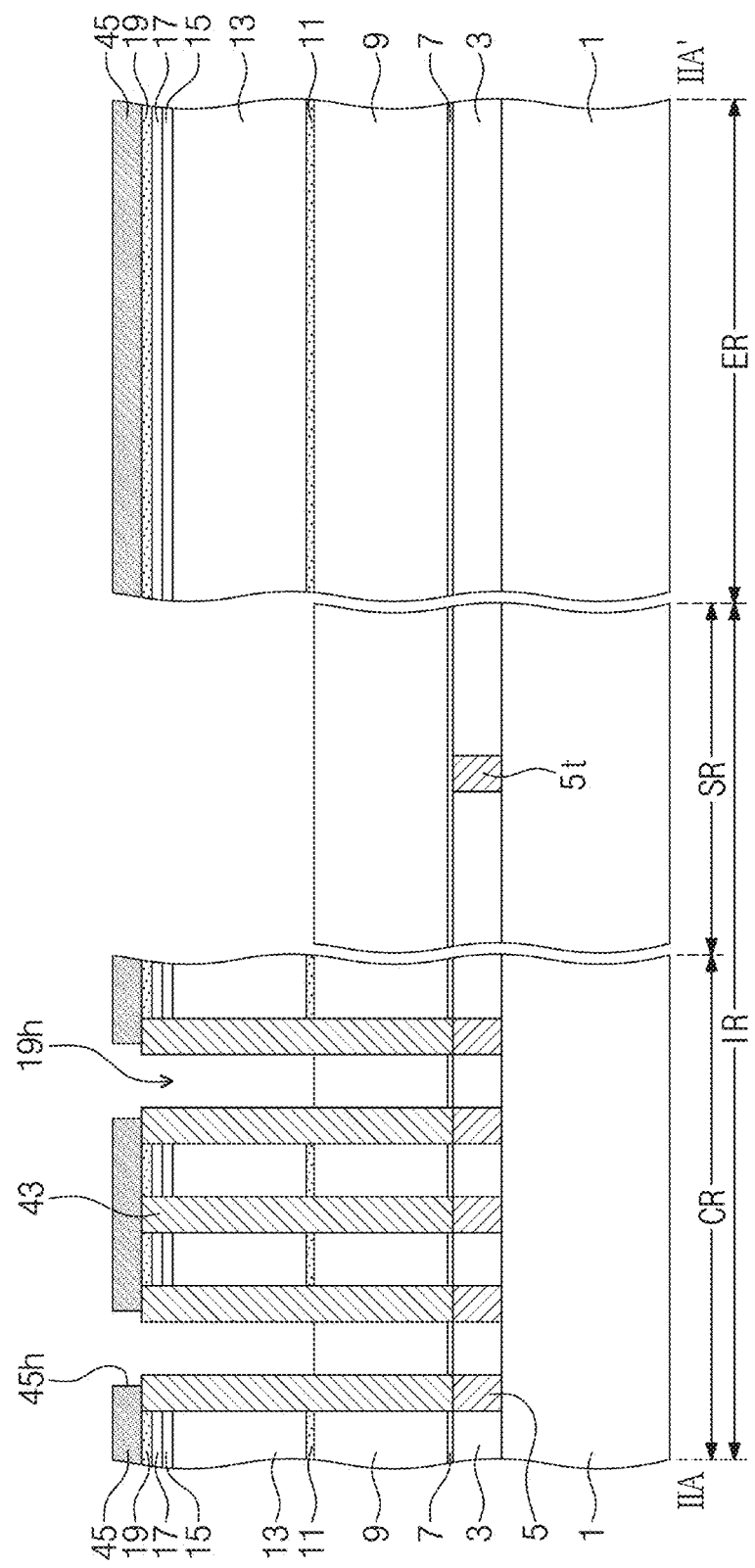

Referring to FIGS. 14A and 15, an anisotropic etching process using the sixth mask pattern 45 as an etch mask may sequentially etch the second supporting layer 19, the second bowing suppressing layer 17, the first bowing suppressing layer 15, the second mold layer 13, and the first supporting layer 11, which are located on the chip region CR and between the adjacent three ones of the lower electrodes 43, to form a supporting hole 19h, which exposes the first mold layer 9. Here, the second supporting layer 19, the second bowing suppressing layer 17, the first bowing suppressing layer 15, the second mold layer 13, and the first supporting layer 11 may be removed from the scribe lane region SR, and thus the first mold layer 9 may be exposed on the scribe lane region SR.

Figure 16:
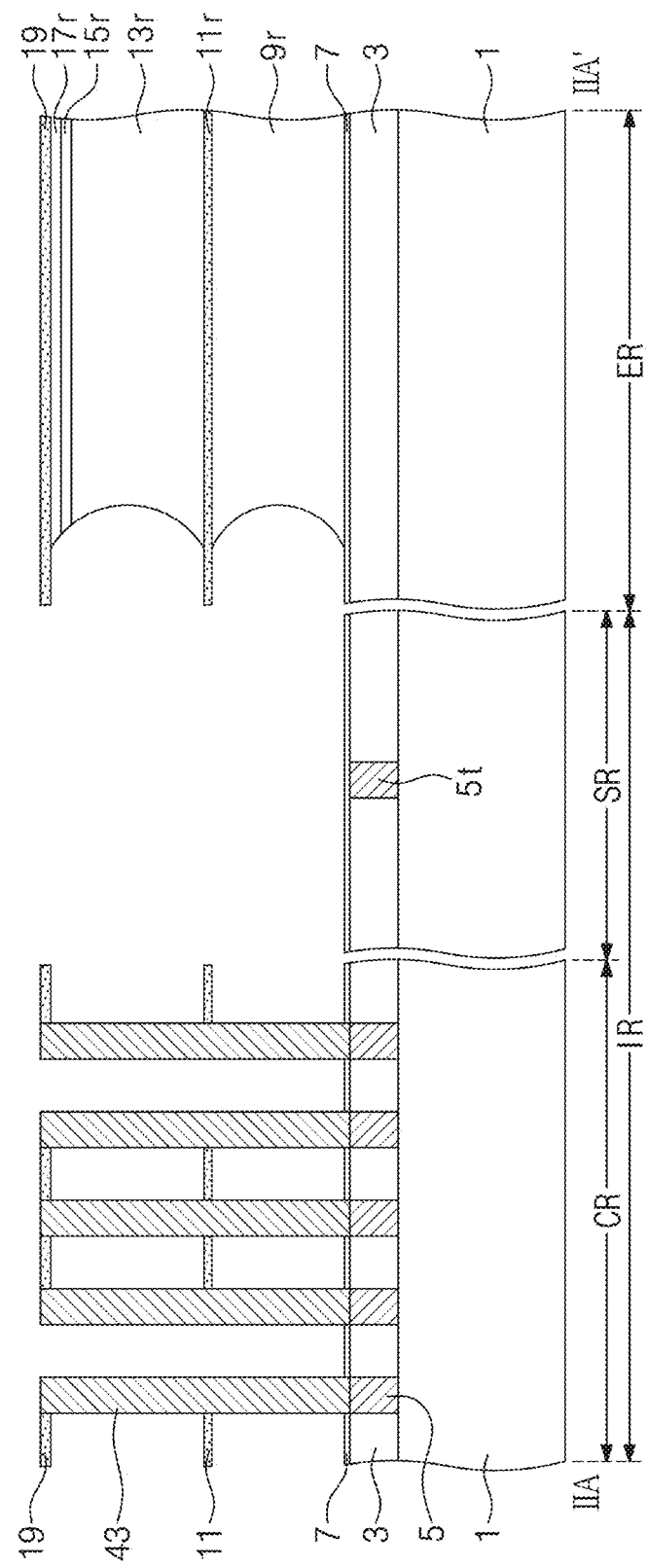

Referring to FIGS. 15 and 16, an isotropic etching process may remove the first and second mold layers 9 and 13 and the first and second bowing suppressing layers 15 and 17 from the wafer inner region IR through the supporting holes 19h and to expose surfaces of the first etch stop layer 7, the first and second supporting layers 11 and 19, and the lower electrodes 43. Here, first and second remaining mold layers 9r and 13r and first and second remaining bowing suppressing layers 15r and 17r may be left on the wafer edge region ER. Because the first and second mold layers 9 and 13 are removed through the isotropic etching process, the first etch stop layer 7 on the scribe lane region SR may not be damaged, and thus the test conductive pattern 51 may be covered with the first etch stop layer 7 and may not be exposed.

Figure 17:
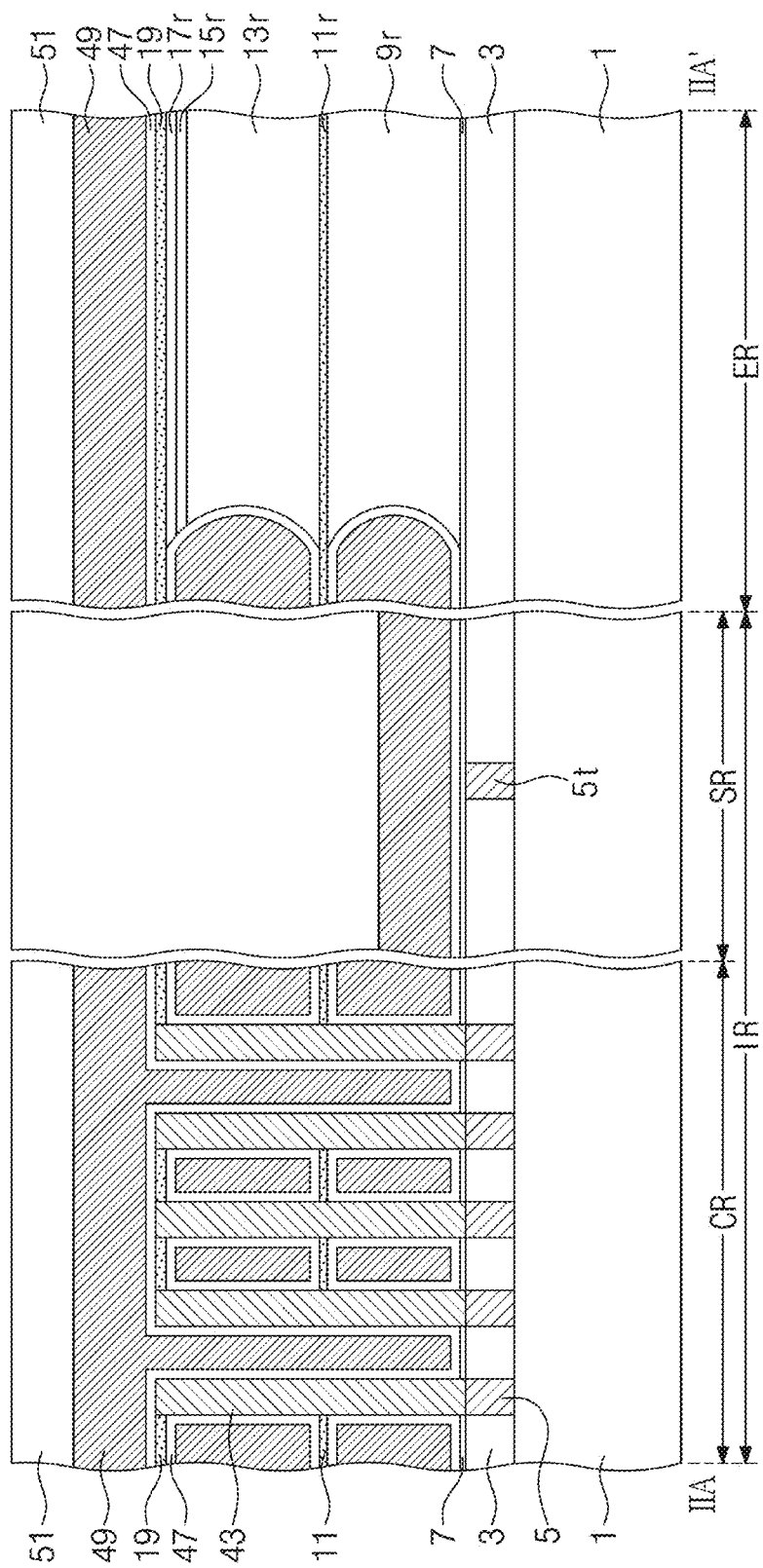
Figure 18:
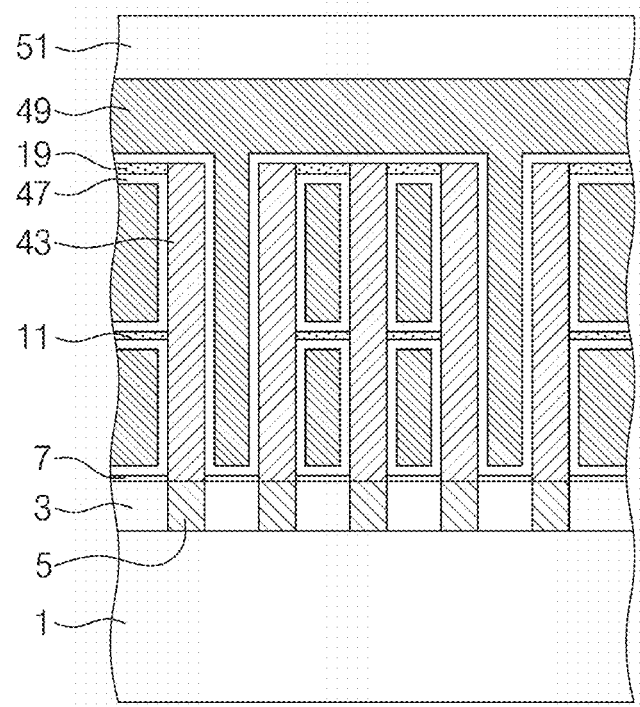

Referring to FIGS. 17 and 18, the dielectric layer 47 may be conformally formed on the semiconductor substrate 1. Thereafter, the upper electrode layer 49 may be formed on the dielectric layer 47. The dielectric layer 47 may be formed of, for example, a metal oxide material (e.g., aluminum oxide), whose dielectric constant is higher than a silicon oxide layer. The upper electrode layer 49 may be formed of or include at least one of a titanium nitride layer, a tungsten layer, a doped poly-silicon layer, or a doped silicon-germanium layer. An upper interlayered insulating layer 51 may be formed on the upper electrode layer 49. Thereafter, a chip-sawing process may remove the scribe lane region SR and the wafer edge region ER, and the chip region CR left after the chip-sawing process may be used as a semiconductor chip. In an example embodiment, a chip-testing process may be additionally performed using the test conductive pattern 51 of the scribe lane region SR, before the chip-sawing process.

In a method of fabricating a semiconductor device according to an example embodiment of the inventive concepts, the step-difference compensation pattern 33p may be formed of a material (e.g., silicon nitride or silicon oxide), which can be planarized by the CMP process, as shown in FIG. 6. In the case where the step-difference compensation pattern is formed of a photoresist pattern, the photoresist pattern may lead to a height difference between the wafer edge region ER and the wafer inner region IR and consequently cause a defocus issue. Further, there may be a difficulty in performing the CMP process on a material such as photoresist pattern or SOH, which is formed by a spin coating process. Thus, it may be difficult to planarize such a material by the CMP process. According to an example embodiment of the inventive concepts, however, it may be possible to perform the CMP process, and this may make it possible to reduce or remove a height difference between the wafer edge region ER and the wafer inner region IR. Accordingly, it may be possible to solve a defocus issue between the wafer edge region ER and the wafer inner region IR.

In a method of fabricating a semiconductor device according to an example embodiment of the inventive concepts, the second etch stop layer 21 and the second supporting layer 19 on the scribe lane region SR or the wafer edge region ER may not be etched, when the lower electrode hole 44 is formed as shown in FIG. 11A. Thus, in the step of FIG. 16, the first etch stop layer 7 may not be damaged to prevent the test conductive pattern 5t from being exposed. In the case where the test conductive pattern 5t is exposed, a lift-off failure may occur in a subsequent cleaning process. For example, during the subsequent cleaning process, a material (e.g., tungsten) in the test conductive pattern 5t may be dissolved in a cleaning solution and then may be precipitated on another region. However, according to an example embodiment of the inventive concepts, it may be possible to prevent this lift-off failure.

Furthermore, in the fabrication method according to an example embodiment of the inventive concepts, an overall fabrication process may be simplified by not forming an additional blank photoresist pattern covering the wafer edge region ER. Accordingly, a process failure may be reduced and a production yield may be increased.

Figure 19:
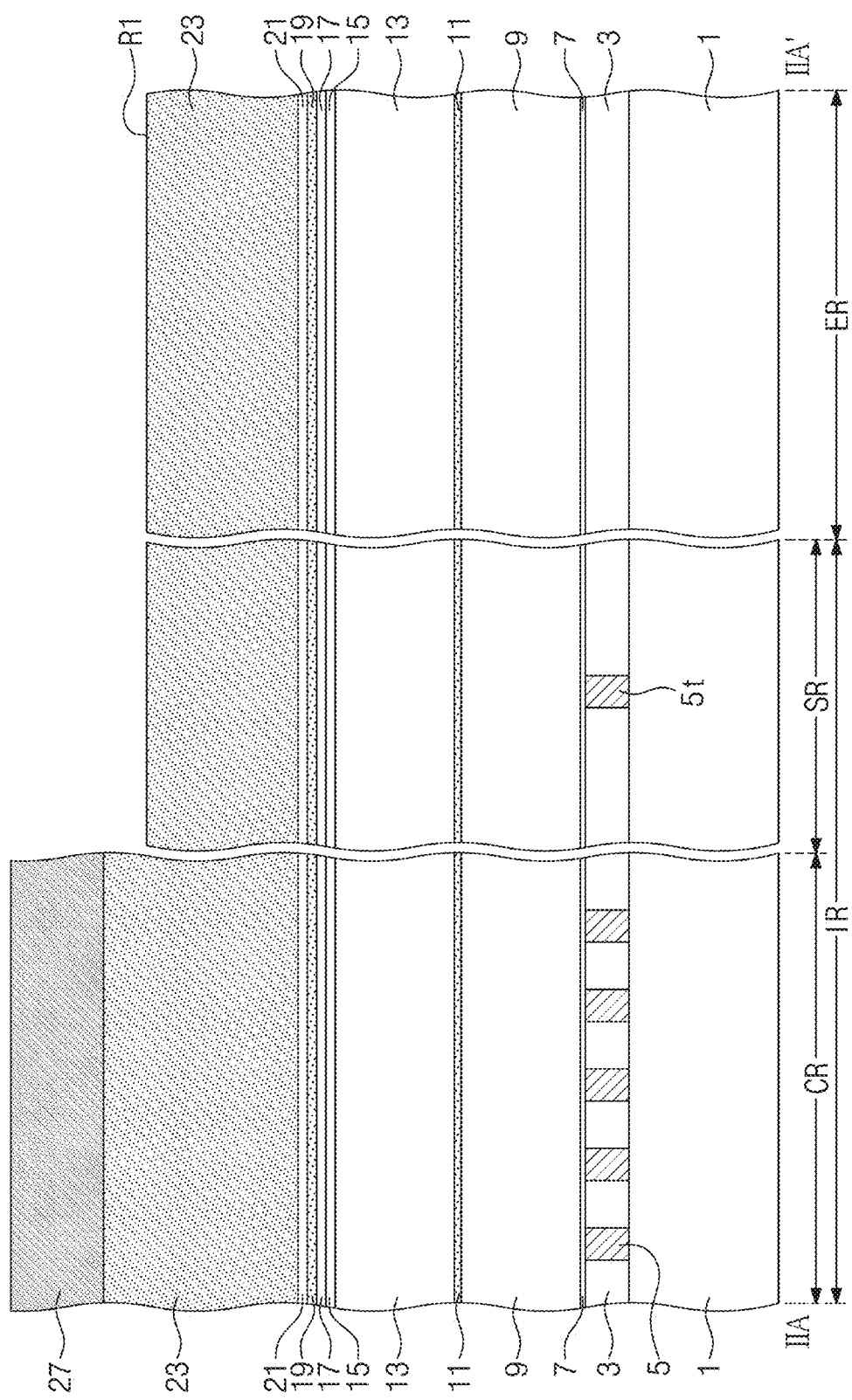
FIGS. 19 to 21 are cross-sectional views taken along a line IIA-IIA' sequentially illustrating a method of fabricating a semiconductor device, according to an example embodiment of the inventive concepts.
Figure 20:
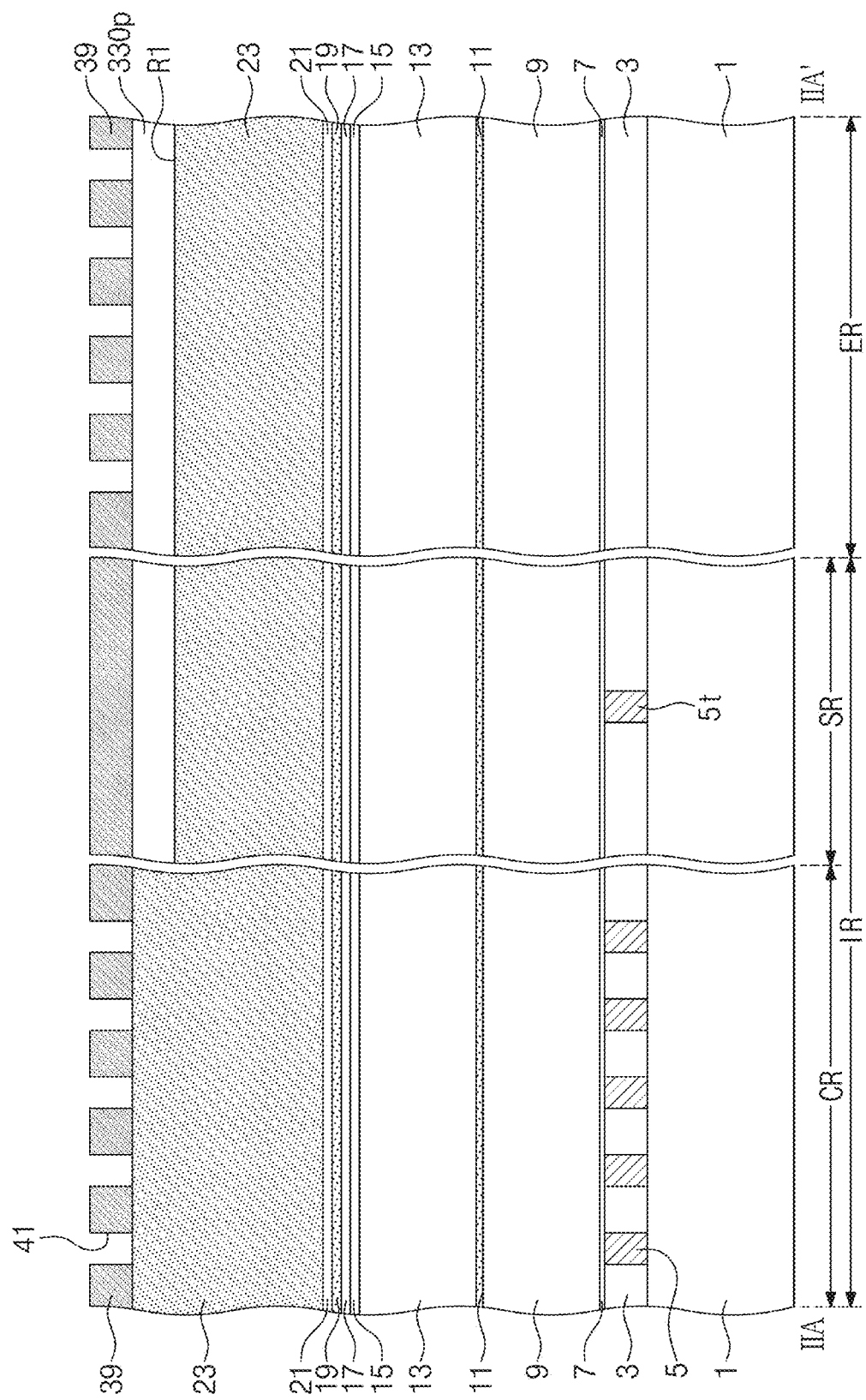
Figure 21:
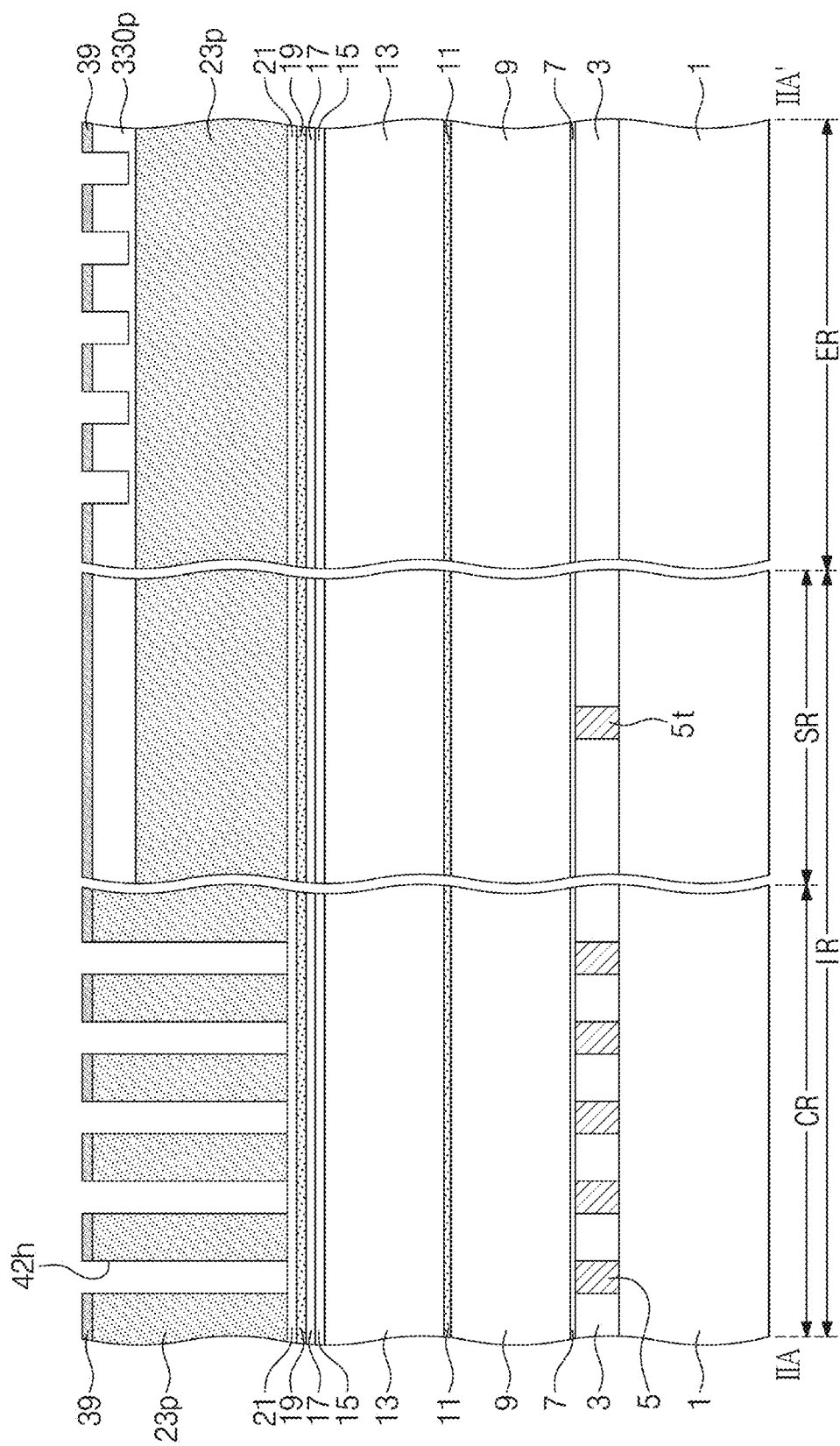

FIGS. 19 to 21 are cross-sectional views sequentially illustrating a method of fabricating a semiconductor device, according to an example embodiment of the inventive concepts.

Referring to FIG. 19, in a fabricating method according to the present example embodiment, the first photoresist pattern 27 may be directly formed on the first mask layer 23, unlike the previous example embodiments of FIG. 2A. The first mask layer 23 may be etched by using the first photoresist pattern 27 to form the first recess region R1 on the wafer edge region ER and the scribe lane region SR adjacent thereto. The first mask layer 23 may be formed of or include, for example, poly-silicon.

Referring to FIGS. 19 and 20, the first photoresist pattern 27 may be removed, and then a step-difference compensation layer may be formed on the semiconductor substrate 1 to fill the first recess region R1. Thereafter, a CMP process may form a step-difference compensation pattern 330p on the first recess region R1. The step-difference compensation layer may be formed of or include a material (e.g., silicon oxide or silicon nitride) having an etching- or polishing-selectivity with respect to the first mask layer 23. The step-difference compensation layer may be formed by a deposition process (e.g., CVD, ALD, and PVD processes), not by a spin coating process. During the CMP process, the first mask layer 23 may be used as a polishing stop layer. Thus, the top surface of the first mask layer 23 may become coplanar with the top surface of the step-difference compensation pattern 330p. The second photoresist pattern 39 may be formed on the first mask layer 23 and the step-difference compensation pattern 330p. The second photoresist pattern 39 may include the first openings 41. The first recess region R1 may have a first depth D1, and the fourth mask pattern 33p may have a first thickness T1. In an example embodiment, the first depth D1 may be substantially equal to the first thickness T1.

Referring to FIGS. 20 and 21, an anisotropic etching process using the second photoresist pattern 39 as a etch mask may etch the first mask layer 23 to form the first mask pattern 23p with the second holes 42h. The second holes 42h may be formed to expose the second etch stop layer 21 in the chip region CR. Furthermore, on the wafer edge region ER and the scribe lane region SR adjacent thereto, the step-difference compensation pattern 330p may hinder the etching process, and thus the top surface of the first mask pattern 23p may not be exposed. The subsequent processes may be performed in the same or similar manner as the processes previously described with reference to FIGS. 11A to 18.

Figure 22:
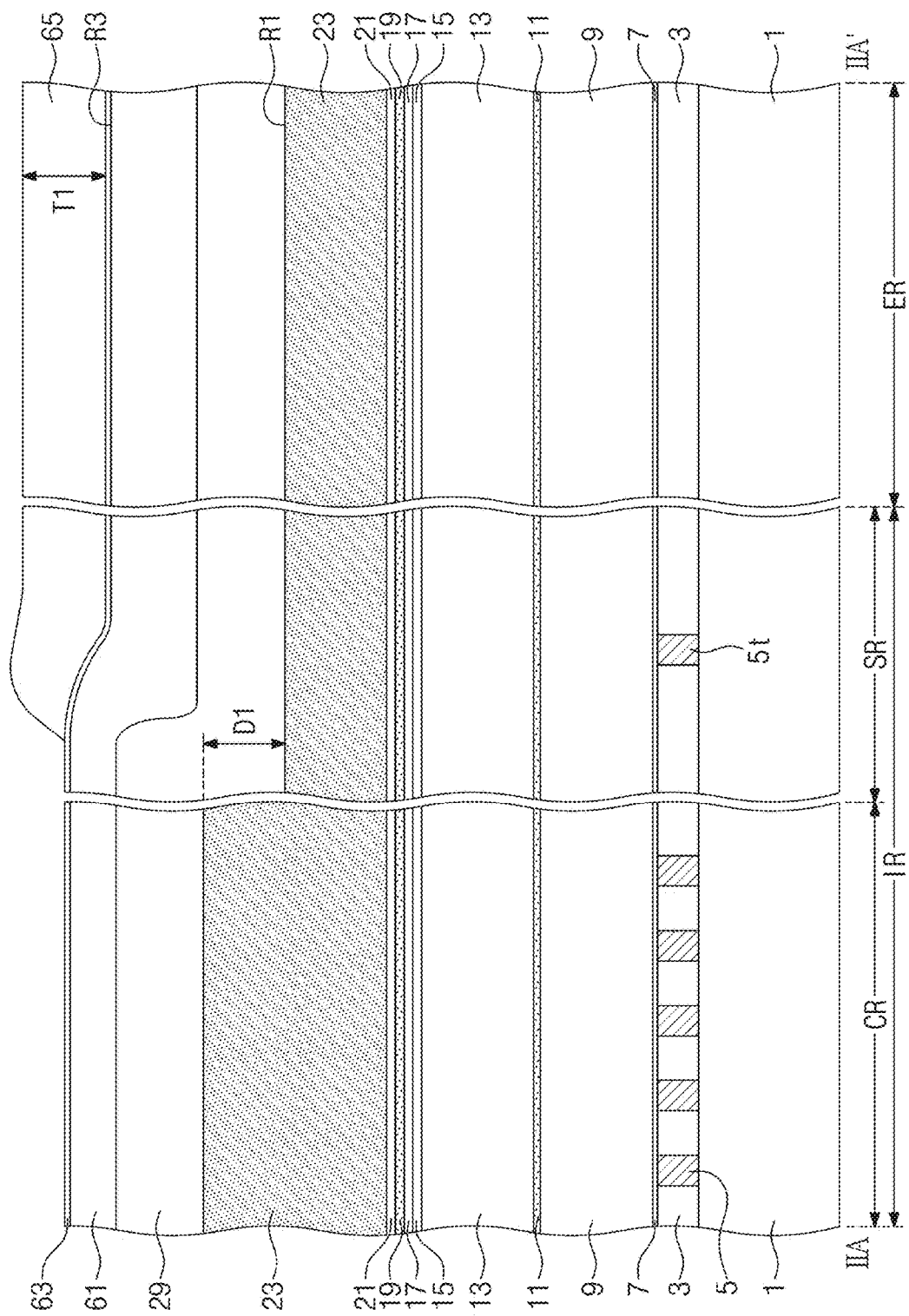
FIGS. 22 to 24 are cross-sectional views taken along a line IIA-IIA' sequentially illustrating a method of fabricating a semiconductor device according to an example embodiment of the inventive concepts.
Figure 23:
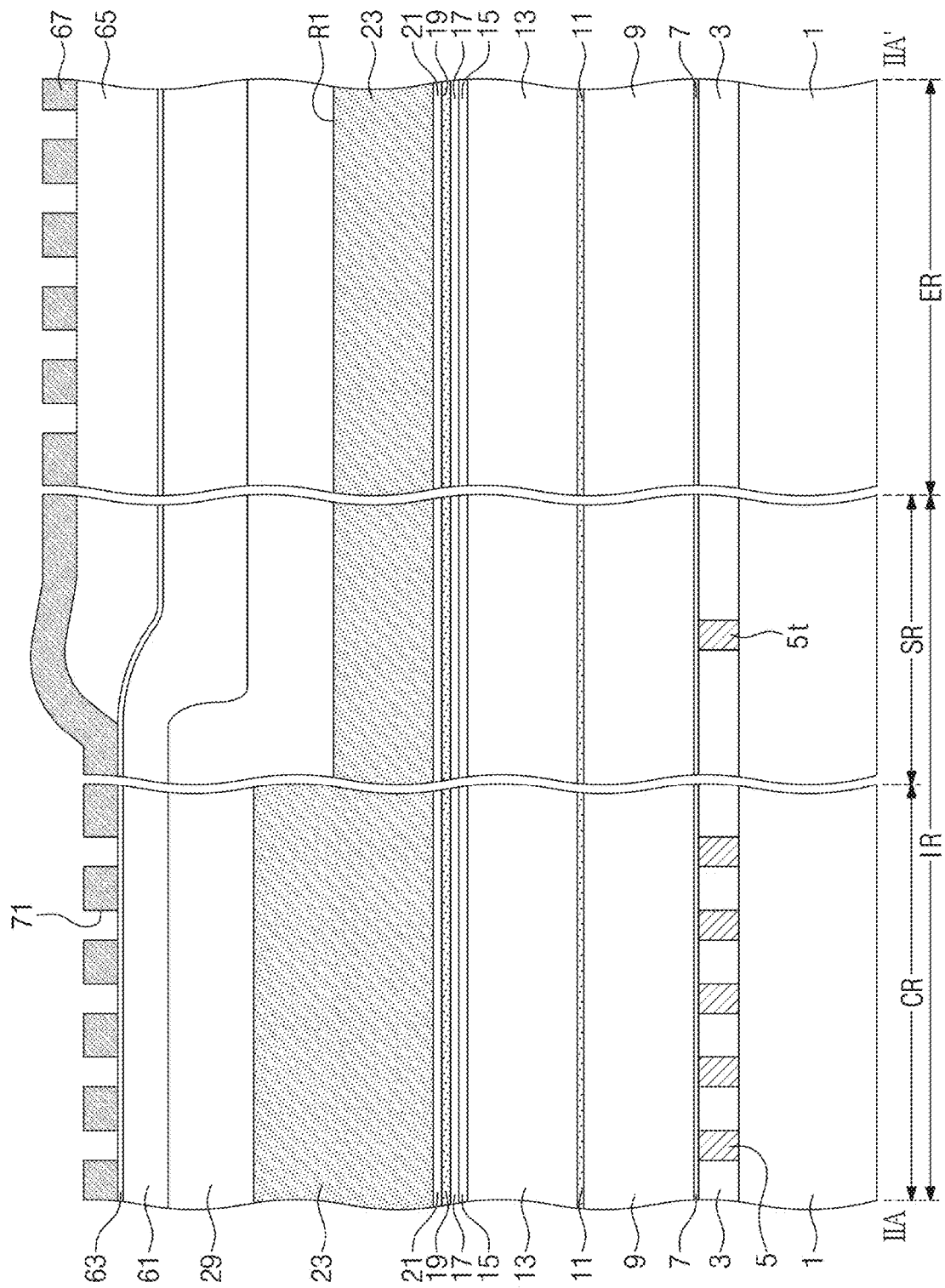
Figure 24:
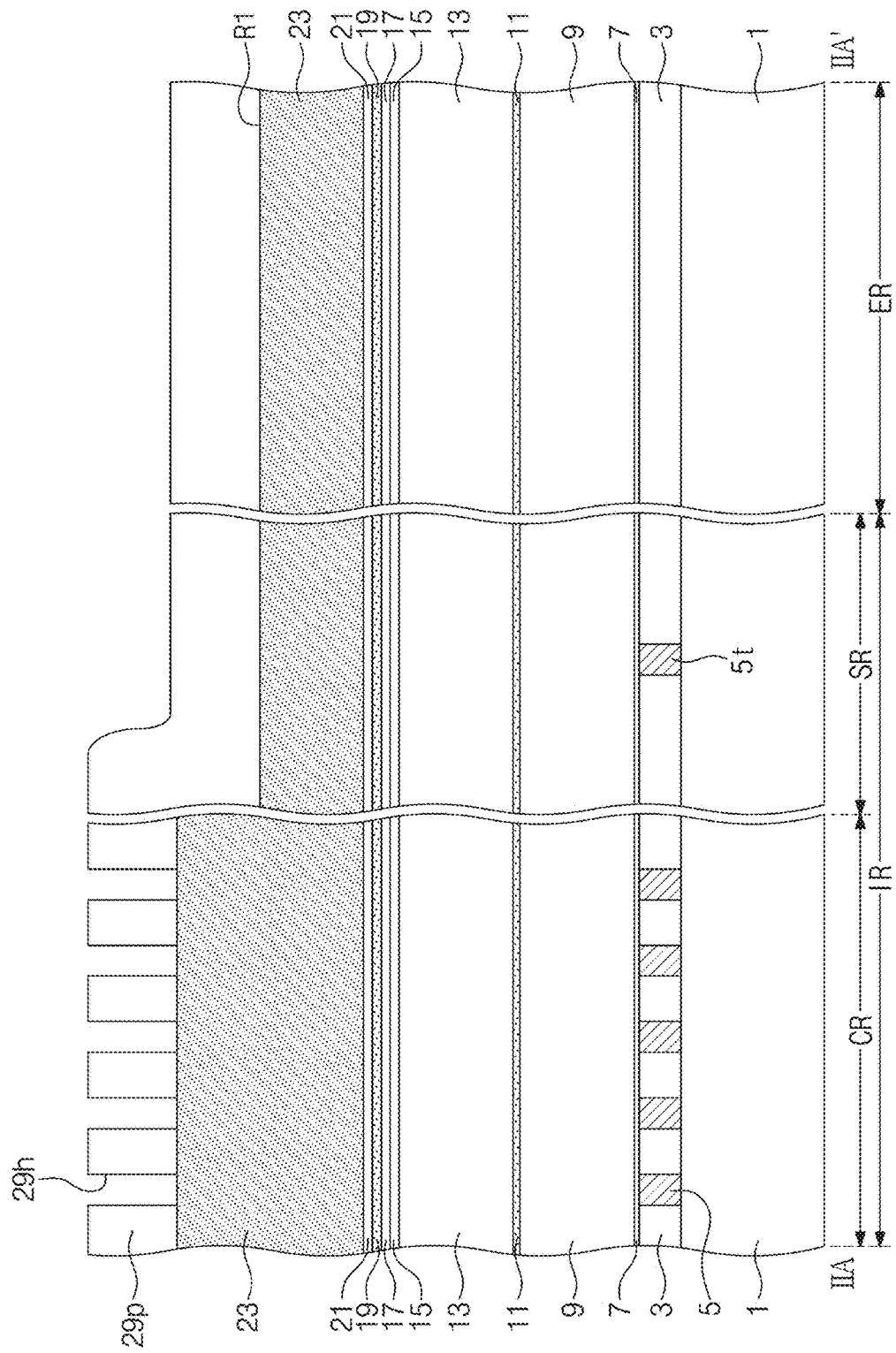

FIGS. 22 to 24 are cross-sectional views sequentially illustrating a method of fabricating a semiconductor device according to an example embodiment of the inventive concepts.

Referring to FIG. 22, the first recess region R1 may be formed to have the first depth D1, when the first recess region R1 is formed in the first mask layer 23 as shown in FIG. 4. In other words, the first recess region R1 may be formed such that a difference in height between the top surface of the first mask layer 23 outside the first recess region R1 and the bottom surface of the first recess region R1, on the chip region CR of the wafer inner region IR, becomes the first depth D1. After the formation of the first recess region R1, the third mask layer 29 may be formed on the first mask layer 23. The third mask layer 29 may be formed by a deposition process (e.g., CVD, ALD, and PVD processes). The third mask layer 29 may be formed of or include a material (e.g., silicon oxide, silicon nitride, or silicon oxynitride), which has an etch selectivity with respect to the first mask layer 23. A planarization auxiliary layer 61 may be formed on the third mask layer 29. The planarization auxiliary layer 61 may be formed by a spin coating process and may be formed of at least one of SOH or SOC materials. The planarization auxiliary layer 61 may contribute to reduce a height difference, which is caused by the first recess region R1, but the planarization auxiliary layer 61 may still have a third recess region R3, which is formed through the transcription of the first recess region R1.

An auxiliary mask layer 63 may be formed on the planarization auxiliary layer 61. The auxiliary mask layer 63 may be used as an anti-reflection layer. The auxiliary mask layer 63 may include a silicon nitride layer or an amorphous silicon layer. The auxiliary mask layer 63 may have a relatively small thickness, and thus the third recess region R3 may not be fully filled with the auxiliary mask layer 63. On the wafer edge region ER, a step-difference compensation pattern 65 may be formed on the auxiliary mask layer 63. The step-difference compensation pattern 65 may fill the third recess region R3. Here, the step-difference compensation pattern 65 may be a photoresist pattern, which is formed by a photolithography process. The step-difference compensation pattern 65 may have the first thickness T1. In an example embodiment, the first thickness T1 may be equal to or substantially same as the first depth D1.

Referring to FIG. 23, a fourth mask pattern 67 with first openings 71 may be formed on the semiconductor substrate 1. The fourth mask pattern 67 may be a photoresist pattern, which is formed by a photolithography process. The first openings 71 may delimit positions of the lower electrode holes. The first openings 71 may be formed not only on the chip region CR of the wafer inner region IR but also on the wafer edge region ER.

Referring to FIGS. 23 and 24, an anisotropic etching process using the fourth mask pattern 67 as an etch mask may etch the structures thereunder. Accordingly, the third mask layer 29 on the chip region CR of the wafer inner region IR may be etched to form the third mask pattern 29p with first holes 29h. Here, the third mask layer 29 on the wafer edge region ER may not be etched due to the presence of the step-difference compensation pattern 65. Accordingly, the first holes 29h of the third mask pattern 29p may not be formed on the wafer edge region ER. The subsequent processes may be performed in the same or similar manner as the processes previously described with reference to FIGS. 10 to 18.

According to an example embodiment of the inventive concepts, in a method of fabricating a semiconductor device, a step-difference compensation pattern may be formed of a material, which can be polished by a chemical mechanical polishing (CMP) process, and thus it may be possible to solve the defocus issue. In addition, it may be possible to prevent an etch stop layer, which is used to protect a lower conductive pattern, from being damaged in an edge region of a wafer or a scribe lane region adjacent thereto, thereby preventing the lift-off failure of an underlying conductive pattern. This may make it possible to increase the production yield.

While some example embodiments of the inventive concepts have been particularly shown and described, it will be understood by one of ordinary skill in the art that variations in form and detail may be made therein without departing from the spirit and scope of the attached claims.

What is claimed is:

1. A method of fabricating a semiconductor device, comprising:
preparing a substrate including a wafer inner region and a wafer edge region, the wafer inner region comprising a chip region and a scribe lane region;
sequentially stacking a mold layer and a supporting layer on the substrate;
forming a first mask layer on the supporting layer, the first mask layer comprising a first stepped region on the wafer edge region;
forming a step-difference compensation pattern on the first stepped region;
forming a second mask pattern including openings on the first mask layer and on the step-difference compensation pattern; and
sequentially etching the first mask layer, the supporting layer, and the mold layer using the second mask pattern as an etch mask to form a plurality of holes in at least the mold layer.

2. The method of claim 1, further comprising, before the forming of the step-difference compensation pattern:
conformally forming a third mask layer on the first mask layer such that a top surface of the third mask layer has a second stepped region, the second stepped region being located on the wafer edge region through transcription of the first stepped region; and
forming a polishing stop pattern to cover the second stepped region of the third mask layer,
wherein the step-difference compensation pattern fills the second stepped region.

3. The method of claim 2, wherein
the third mask layer and the step-difference compensation pattern comprise a same material, and
the polishing stop pattern comprises a material having a polishing selectivity with respect to the step-difference compensation pattern.

4. The method of claim 2, further comprising:
forming a planarization auxiliary layer to cover the third mask layer and the step-difference compensation pattern, before the forming of the second mask pattern, wherein
the planarization auxiliary layer is formed by a spin coating method, and
the planarization auxiliary layer is formed of a material different from the third mask layer and the step-difference compensation pattern.

5. The method of claim 2, wherein the forming a polishing stop pattern and the forming a step-difference compensation pattern comprise:
sequentially stacking a polishing stop layer and a step-difference compensation layer on the third mask layer, the step-difference compensation layer filling the second stepped region of the third mask layer;
performing a polishing process on the step-difference compensation layer to expose the polishing stop layer on the wafer inner region and to form the step-difference compensation pattern on the wafer edge region; and
removing the polishing stop layer from the chip region to form the polishing stop pattern that exposes a top surface of the third mask layer.

6. The method of claim 1, wherein the step-difference compensation pattern comprises a silicon oxide layer, a silicon nitride layer, or a photoresist pattern.

7. The method of claim 1, wherein a depth of the first stepped region is equal to a thickness of the step-difference compensation pattern.

8. The method of claim 1, wherein the forming a first mask layer comprises:
forming an auxiliary mask layer to cover an entire top surface of the first mask layer;
forming a photoresist pattern on the auxiliary mask layer;
etching the auxiliary mask layer using the photoresist pattern to form an auxiliary mask pattern; and
etching the first mask layer using the auxiliary mask pattern to form the first stepped region,
wherein the photoresist pattern is formed to cover the auxiliary mask layer on the wafer inner region and to expose the auxiliary mask layer on the wafer edge region.

9. The method of claim 1, before the forming a step-difference compensation pattern, further comprising:
forming a third mask layer on the first mask layer; and
forming a planarization auxiliary layer on the third mask layer, wherein
the step-difference compensation pattern is formed on the planarization auxiliary layer,
the third mask layer is formed by a deposition process, and
the planarization auxiliary layer is formed by a spin coating process.

10. The method of claim 1, further comprising:
forming a bowing suppressing layer between the mold layer and the supporting layer,
wherein the bowing suppressing layer comprises a material having an etch selectivity with respect to both of the mold layer and the supporting layer.

11. The method of claim 1, further comprising:
forming a bowing suppressing layer between the mold layer and the supporting layer, wherein
the bowing suppressing layer comprises first sub-bowing suppressing layers and second sub-bowing suppressing layers, which are alternately stacked, and
the second sub-bowing suppressing layers comprises a same material as the mold layer.

12. The method of claim 11, wherein each of the second sub-bowing suppressing layers is thicker than each of the first sub-bowing suppressing layers.

13. The method of claim 1, further comprising:
removing the second mask pattern and the first mask layer;
forming lower electrodes in the holes, respectively;
patterning the supporting layer to form a supporting hole;
removing the mold layer through the supporting hole;
forming a dielectric layer to cover the lower electrodes and the supporting layer; and
forming an upper electrode layer to cover the dielectric layer.

14. The method of claim 1, further comprising:
forming a lower mold layer and a lower supporting layer on the substrate, before the sequentially stacking a mold layer and a supporting layer on the substrate,
wherein the holes are formed to penetrate through the lower mold layer and the lower supporting layer.

15. A method of fabricating a semiconductor device, comprising:
preparing a substrate including a wafer inner region and a wafer edge region;
sequentially stacking a mold layer and a supporting layer on the substrate;
forming a first mask layer on the supporting layer, the first mask layer comprising a first stepped region on the wafer edge region;
forming a step-difference compensation pattern to fill the first stepped region of the first mask layer and to expose a top surface of the first mask layer on the wafer inner region;
forming a second mask pattern on the first mask layer and on the step-difference compensation pattern, the second mask pattern including openings; and
sequentially etching the first mask layer, the supporting layer, and the mold layer using the second mask pattern as an etch mask to form a plurality of holes in at least the mold layer.

16. The method of claim 15, wherein the step-difference compensation pattern comprises a material polishable by a chemical mechanical polishing (CMP) process.

17. The method of claim 15, wherein the forming a first mask layer comprises:
forming a first sub-mask layer on the supporting layer;
removing a portion of the first sub-mask layer on the wafer edge region to form a second stepped region;
forming a second sub-mask layer on the first sub-mask layer; and
forming a planarization auxiliary layer on the second sub-mask layer, wherein
the first sub-mask layer, the second sub-mask layer, and the planarization auxiliary layer constitute the first mask layer, and
the first stepped region is formed on the planarization auxiliary layer.

18. The method of claim 17, wherein the step-difference compensation pattern is formed of a photoresist pattern.

19. A method of fabricating a semiconductor device, comprising:
preparing a substrate including a wafer inner region and a wafer edge region, the wafer inner region comprising a chip region and a scribe lane region;
sequentially stacking a mold layer, a supporting layer, and a first mask layer on the substrate;
removing a portion of the first mask layer on the wafer edge region to form a first stepped region in the first mask layer;
forming a planarization mask layer on the first mask layer, the planarization mask layer filling the first stepped region, a top surface of the planarization mask layer having a same height in the wafer inner region and the wafer edge region;
forming a second mask pattern with openings, on the planarization mask layer; and
sequentially etching the planarization mask layer, the first mask layer, the supporting layer, and the mold layer using the second mask pattern as an etch mask to form holes in at least the mold layer.

20. The method of claim 19, wherein
the planarization mask layer comprises a step-difference compensation pattern, and the step-difference compensation pattern is located on the wafer edge region and is absent on the chip region of the wafer inner region.

* * * * *